US011497153B2

(12) United States Patent
Amma et al.

(10) Patent No.: US 11,497,153 B2
(45) Date of Patent: Nov. 8, 2022

(54) COMPONENT SUPPLY DEVICE AND TAPE FEEDER

(71) Applicant: YAMAHA HATSUDOKI KABUSHIKI KAISHA, Iwata (JP)

(72) Inventors: Katsuyuki Amma, Shizuoka (JP); Yoichi Matsushita, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 338 days.

(21) Appl. No.: 16/758,032

(22) PCT Filed: Oct. 31, 2017

(86) PCT No.: PCT/JP2017/039305
§ 371 (c)(1),
(2) Date: Apr. 21, 2020

(87) PCT Pub. No.: WO2019/087291
PCT Pub. Date: May 9, 2019

(65) Prior Publication Data
US 2021/0204457 A1 Jul. 1, 2021

(51) Int. Cl.
*H05K 13/08* (2006.01)
*H05K 13/04* (2006.01)
*B65H 35/00* (2006.01)

(52) U.S. Cl.
CPC ......... *H05K 13/081* (2018.08); *B65H 35/006* (2013.01); *H05K 13/0419* (2018.08); *H05K 13/086* (2018.08); *Y10T 29/53174* (2015.01)

(58) Field of Classification Search
CPC ............... H05K 13/02; H05K 13/0417; H05K 13/0419; H05K 13/081; H05K 13/082;
(Continued)

(56) References Cited

U.S. PATENT DOCUMENTS

| 4,610,083 A * | 9/1986 | Campisi ............. H05K 13/0452 227/1 |
| 2003/0219330 A1* | 11/2003 | Lyndaker ........... H05K 13/0417 414/416.1 |

(Continued)

FOREIGN PATENT DOCUMENTS

| CN | 101841999 A | 9/2010 |
| CN | 104429175 A | 3/2015 |

(Continued)

OTHER PUBLICATIONS

Machine translation of JP 2017/152593 from EPO website (Espacenet. com) (Year: 2017).*

(Continued)

*Primary Examiner* — Peter Dungba Vo
*Assistant Examiner* — Joshua D Anderson
(74) *Attorney, Agent, or Firm* — Studebaker & Brackett PC

(57) ABSTRACT

A component supply device includes a plurality of kinds of tape feeders capable of mounting a first component storing tape by which supplying of components is performed precedingly, and a second component storing tape by which supplying of components is performed succeedingly; a component sensor configured to detect runout of the components in the first component storing tape; and a control unit configured to control a tape feeding operation. A specified discharge length by which the first component storing tape is discharged at the time of occurrence of the runout of the components is preliminarily set for each kind of the tape feeder. The control unit is configured to make the tape feeder perform a tape feeding operation for feeding the first component storing tape by the specified discharge length when the component sensor detects the runout of the components in the first component storing tape.

9 Claims, 11 Drawing Sheets

(58) Field of Classification Search
CPC .............. H05K 13/086; Y10T 29/4913; Y10T 29/53174; Y10T 29/53178; B65H 35/006
See application file for complete search history.

(56) References Cited

U.S. PATENT DOCUMENTS

| | | |
|---|---|---|
| 2015/0115093 A1 | 4/2015 | Tanokuchi et al. |
| 2016/0192548 A1 | 6/2016 | Ohashi et al. |
| 2016/0194171 A1 | 7/2016 | Matsumori et al. |
| 2016/0198595 A1 | 7/2016 | Matsumori et al. |
| 2016/0198597 A1 | 7/2016 | Matsumori et al. |
| 2016/0198598 A1 | 7/2016 | Matsumori et al. |
| 2017/0142876 A1 | 5/2017 | Kato |
| 2019/0037740 A1 | 1/2019 | Matsumori et al. |

FOREIGN PATENT DOCUMENTS

| | | |
|---|---|---|
| EP | 2 827 692 A1 | 1/2015 |
| JP | 2011-071257 A | 4/2011 |
| JP | 2015-225968 A | 12/2015 |
| JP | 2016-127217 A | 7/2016 |
| JP | 2017-152593 A | 8/2017 |
| WO | 2015/029122 A1 | 3/2015 |
| WO | 2016/002029 A1 | 1/2016 |

OTHER PUBLICATIONS

International Search Report issued in PCT/JP2017/039305; dated Dec. 12, 2017.

\* cited by examiner

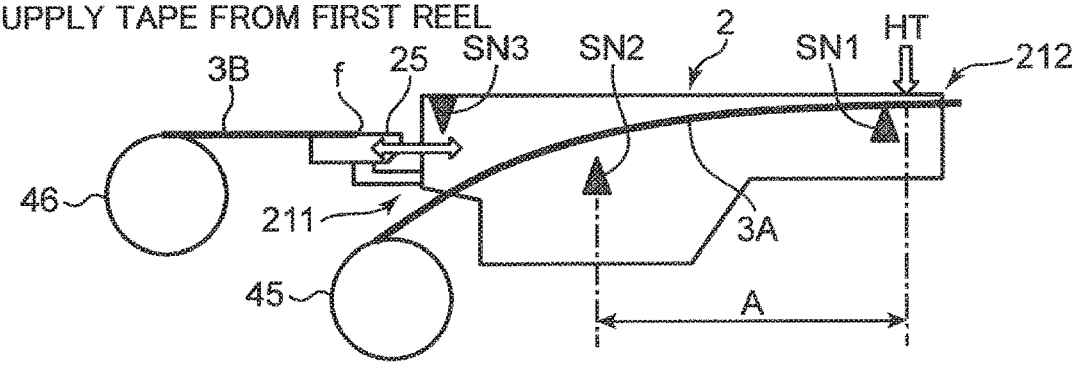
FIG.7A SUPPLY TAPE FROM FIRST REEL
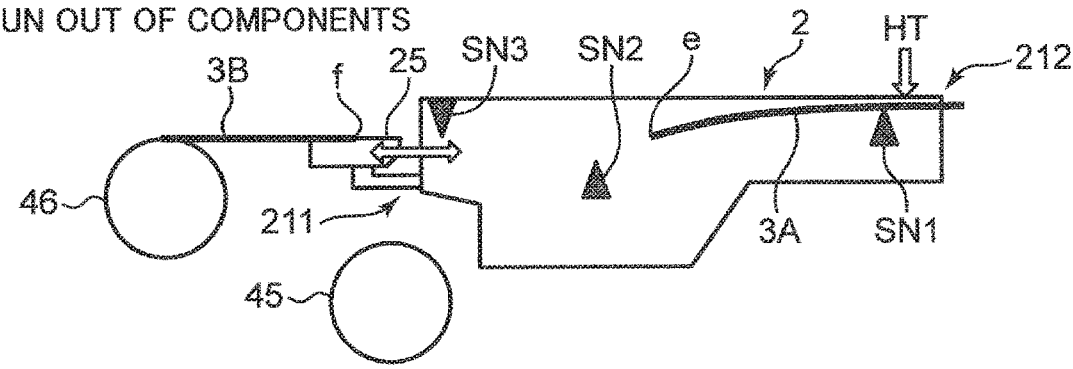
FIG.7B RUN OUT OF COMPONENTS
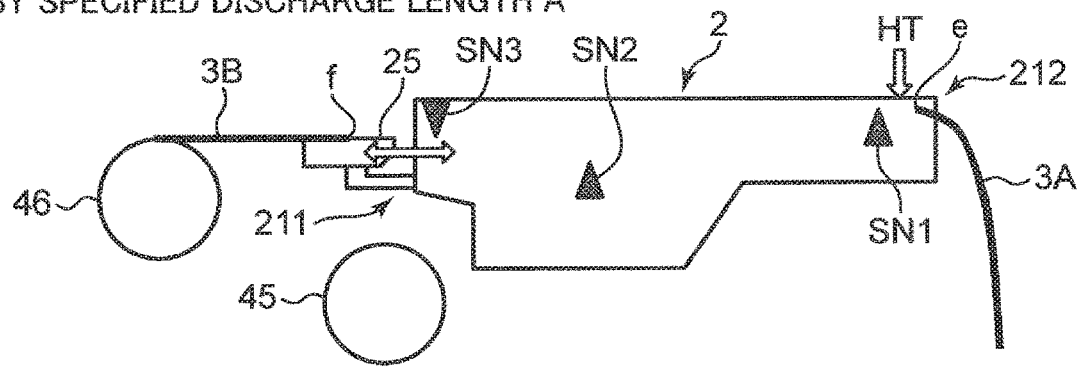
FIG.7C FEED COMPONENT STORING TAPE BY SPECIFIED DISCHARGE LENGTH A
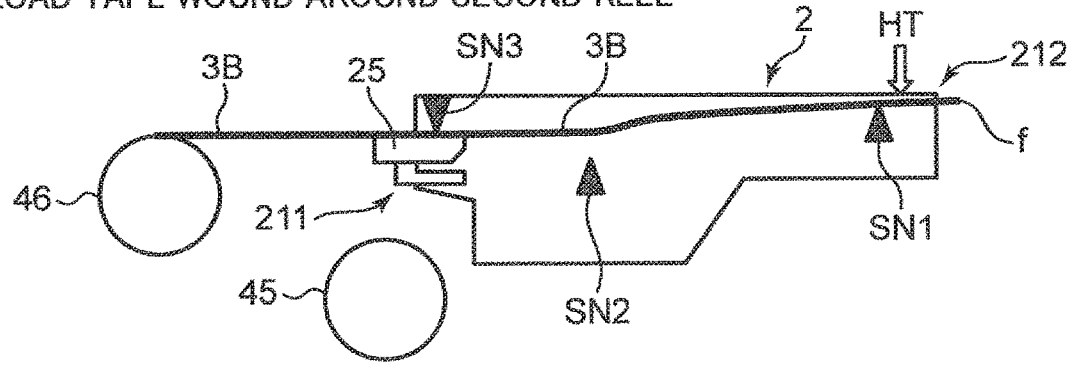
FIG.7D LOAD TAPE WOUND AROUND SECOND REEL

COMPONENT SUPPLY DEVICE AND TAPE FEEDER

CROSS-REFERENCE TO RELATED APPLICATION

This application is a National Stage of International Patent Application No. PCT/JP2017/039305, filed Oct. 31, 2017, the entire content of which is incorporated herein by reference.

BACKGROUND

Technical Field

The present disclosure relates to a tape feeder which supplies a component to a component mounting apparatus for mounting the component on a board or the like in a state where the component is stored in a component storing tape, and a component supply device which includes the tape feeder.

Background Art

On a component mounting apparatus which mounts electronic components such as chip components or IC components (hereinafter, simply referred to as "components") on a printed circuit board, a component supply device which includes a tape feeder for feeding a component storing tape in which components are stored to a predetermined component takeout position is mounted. As such a tape feeder, there has been known an automatic loading type tape feeder where an operation for manually joining a first component storing tape which supplies components precedingly and a second component storing tape for supplying components succeedingly when the preceding component storing tape runs out of the components (splicing) is unnecessary, as described, for example, in JP 2011-71257 A.

In the automatic loading type tape feeder, the first component storing tape is loaded on the tape feeder such that the first component storing tape advances to a component takeout position, and a distal end of the second component storing tape is set at a tape inlet of the tape feeder in advance. When feeding of the first component storing tape and taking out of the components progress and the first component storing tape runs out of the components, the second component storing tape is automatically loaded. When a runout of the components of the first component storing tape is detected before such loading, a tape discharging operation for feeding the first component storing tape is performed until a rear end of the tape is discharged from the tape feeder.

Conventionally, the tape discharging operation is performed depending on a detection result of a tape sensor which is basically disposed on a tape conveyance path of the tape feeder. That is, the tape sensor which detects the presence of the first component storing tape is disposed in the vicinity of a tape outlet of the tape feeder. Then, until a point of time that a runout of the components is detected, the tape discharging operation is started and the tape sensor detects a rear end of the first component storing tape, a tape feeding operation of the first component storing tape is performed.

However, in the above-described method, in the case where the tape sensor cannot detect the rear end of the first component storing tape because of any failure, the tape discharging operation is continued in an endless manner. For example, in the case where a failure occurs in the tape sensor or in a control system of the tape sensor, or in the case where a sprocket which feeds the component storing tape generates idling, there arises a drawback that a controller of the tape feeder cannot determine finishing of the tape discharging operation.

SUMMARY

Accordingly, the present disclosure provides an automatic loading type tape feeder, and a component supply device which includes such a tape feeder, wherein after a runout of components of a preceding component storing tape is detected, a tape discharging operation of the component storing tape can be performed properly without producing a waste.

According to an aspect of the present disclosure, there is provided a component supply device which includes a plurality of kinds of tape feeders configured to supply components stored in component storing tapes to a predetermined component takeout position, the tape feeders being capable of mounting and feeding a first component storing tape by which supplying of components is performed precedingly, and a second component storing tape by which supplying of components is performed succeedingly; a component sensor configured to detect runout of the components in the first component storing tape; and a control unit configured to control a tape feeding operation of the first and second component storing tapes in the plurality of kinds of tape feeders. A specified discharge length by which the first component storing tape is discharged from the tape feeder at a time of occurrence of the runout of the components is preliminarily set for each kind of the tape feeder. The control unit is configured to make the tape feeder perform a tape feeding operation for feeding the first component storing tape by the specified discharge length when the component sensor detects the runout of the components in the first component storing tape.

According to another aspect of the present disclosure, there is provided a tape feeder being capable of mounting and feeding a first component storing tape by which supplying of components is performed precedingly, and a second component storing tape by which supplying of components is performed succeedingly, the tape feeder being configured to supply the components stored in the first and second component storing tapes to a predetermined component takeout position, the tape feeder including a component sensor configured to detect runout of the components in the first component storing tape; and a control unit configured to control a tape feeding operation of the first and second component storing tapes in the plurality of kinds of tape feeders. The control unit is configured to make the tape feeder perform a tape feeding operation for feeding the first component storing tape by a specified discharge length which is preliminarily determined for feeding the first component storing tape from the tape feeder when the component sensor detects the runout of the components in the first component storing tape.

BRIEF DESCRIPTION OF THE DRAWINGS

FIGS. 7A to 7D are schematic views showing a progress state of an automatic loading operation including a tape discharging operation according to the first embodiment;

DETAILED DESCRIPTION

Hereinafter, an embodiment of a component supply device according to the present disclosure is described in detail with reference to drawings.

[Configuration of Component Mounting Apparatus]

Figure 1:
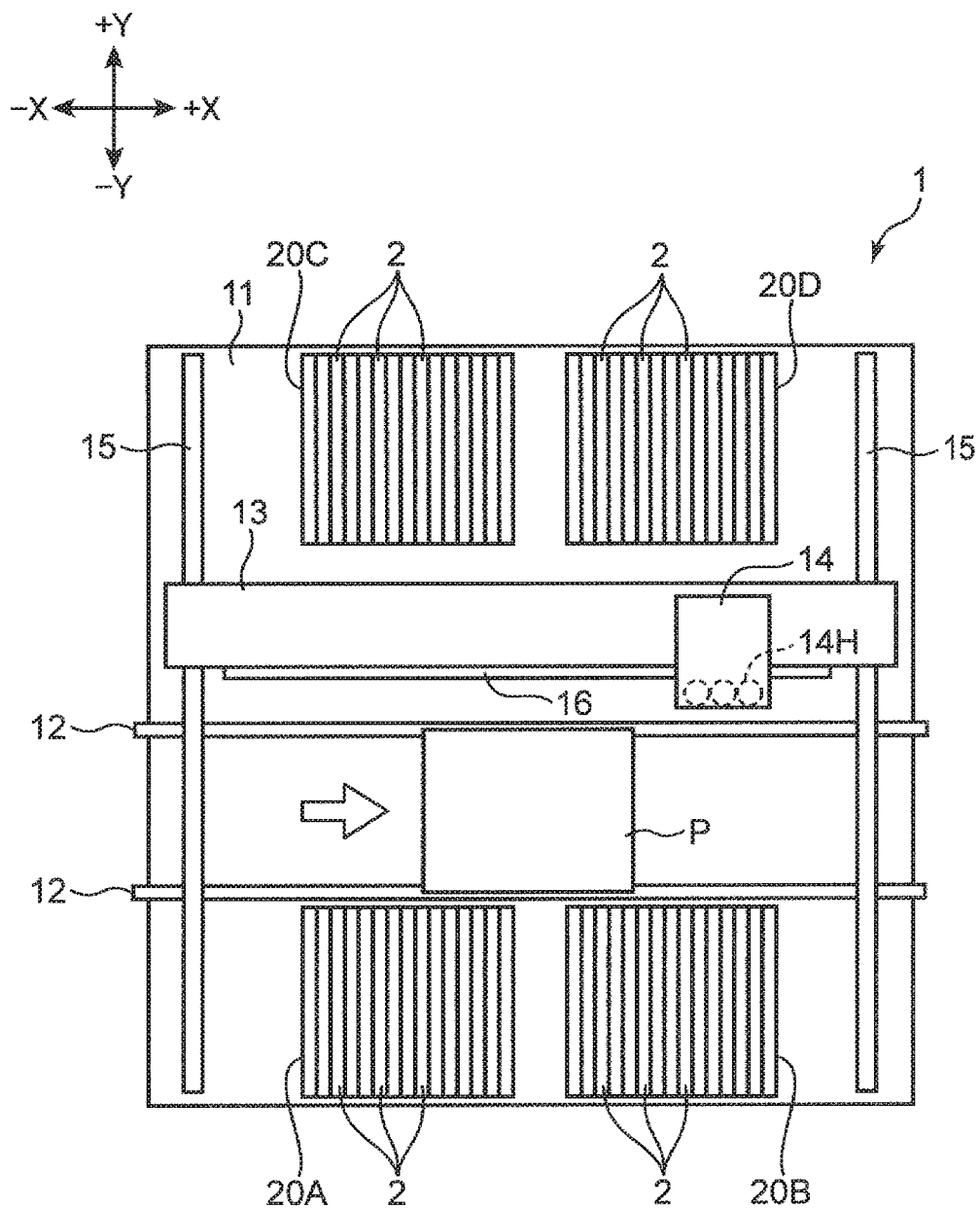
FIG. 1 is a plan view schematically showing the configuration of a component mounting apparatus to which a component supply device according to the present disclosure is applied.

FIG. 1 is a plan view schematically showing a configuration of a component mounting apparatus 1 to which a component supply device (component supply units 20A to 20D) according to the present disclosure is applied. The component mounting apparatus 1 is an apparatus which produces a component mounting board by mounting components on a board P such as a printed circuit board. The component mounting apparatus 1 includes a base unit 11, a pair of conveyors 12, a moving frame 13, a head unit 14, a Y-axis drive mechanism 15, an X-axis drive mechanism 16, and component supply units 20A, 20B, 20C, and 20D.

The base unit 11 is a rectangular platform on which the each unit which forms the component mounting apparatus 1 are mounted. The pair of conveyors 12 is conveyors for conveying the board P, and is arranged on the base unit 11 so as to extend in an X direction. The conveyors 12 carry the board P in the component mounting apparatus 1 from a -X side, and convey the board P to a predetermined operation position on a +X side (a position on the board P shown in FIG. 1), and temporarily stop the board P. The component is mounted on the board P at such an operation position. After such a mounting operation is finished, the conveyors 12 further convey the board P onto a +X side, and carry out the board P outside the component mounting apparatus 1.

The moving frame 13 is a frame which extends in the X direction, and is supported on the base unit 11 in a movable manner in the Y direction. The head unit 14 is mounted on the moving frame 13 in a movable manner in the X direction. That is, the head unit 14 is movable in the Y direction along with the movement of the moving frame 13, and is movable in the X direction along the moving frame 13. The head unit 14 includes a plurality of heads 14H which hold the components mounted on the board P by suction. The heads 14H hold the components by suction (take out the components) at a component takeout position HT (FIG. 2) described later, moves the components on the board P, and mounts the components at predetermined mounting positions on the board.

The Y-axis drive mechanisms 15 are mechanisms which are disposed at end portions of the base unit 11 on a +X side and a -X side as a pair, and move the moving frame 13 in the Y direction. The Y-axis drive mechanisms 15 are formed of, for example, a ball screw shaft extending in the Y direction, a drive motor for rotatably driving the ball screw shaft, and a ball nut disposed on the moving frame 13 and threadedly engaging with the ball screw shaft. The X-axis drive mechanism 16 is a mechanism which is disposed on the moving frame 13, and moves the head unit 14 in the X direction along the moving frame 13. In the same manner as the Y-axis drive mechanism 15, the X-axis drive mechanism 16 is formed of, for example, a ball screw shaft extending in the X direction, a drive motor, and a ball nut.

The component supply units 20A to 20D (component supply devices) supply components to be mounted on the board P. Two component supply units 20A, 20B are disposed in a region of the base unit 11 on a -Y side, and two component supply units 20C, 20D are disposed in a region of the base unit 11 on a +Y side with the conveyors 12 sandwiched between these two regions. A plurality of tape feeders 2 arranged in the X direction are mounted on the respective component supply units 20A to 20D.

Each tape feeder 2 supplies components E stored in the component storing tape 3 (FIG. 3) to the predetermined component takeout position HT. Although described in detail later, the tape feeder 2 is an automatic loading type tape feeder which allows mounting of the proceeding component storing tape and the succeeding component storing tape on the tape feeder, and can continuously feed both the component storing tapes without performing a splicing operation. A plurality of kinds of tape feeders 2 which differ from each other in size, a tape conveyance path and kind can be mounted on the respective component supply units 20A to 20D.

[Details of Tape Feeder]

Figure 2:
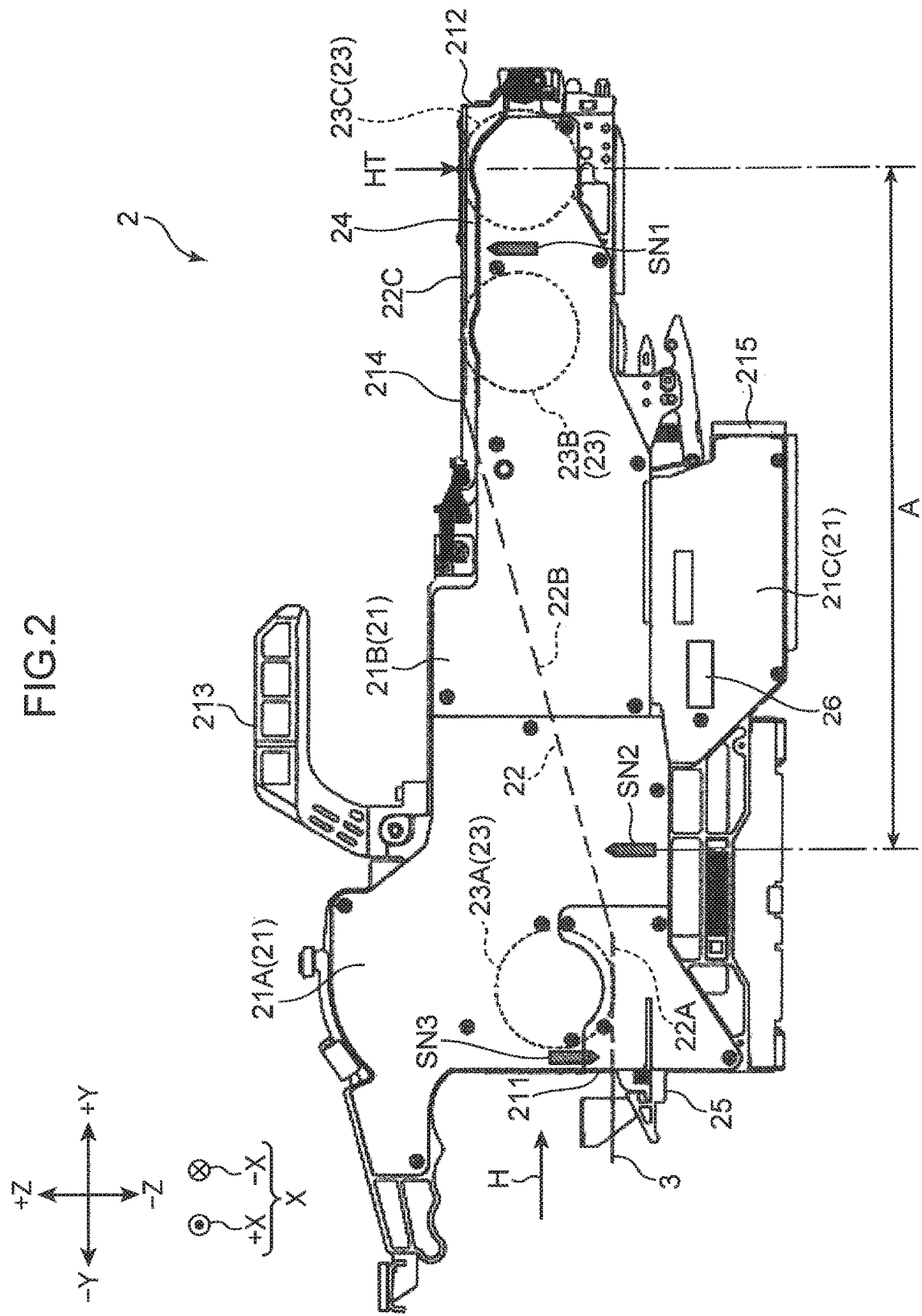
FIG. 2 is a side view of a tape feeder mounted on the component supply device.
Figure 3:
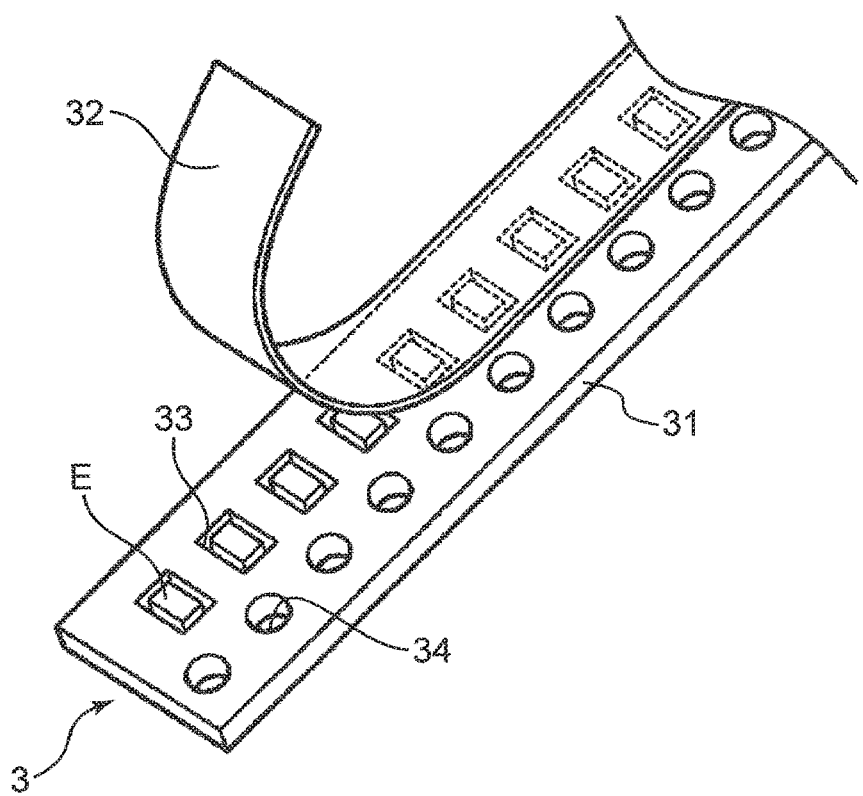
FIG. 3 is a perspective view of a component storing tape.

FIG. 2 is a side view of the tape feeder 2, and FIG. 3 is a perspective view showing the component storing tape 3 fed by the tape feeder 2. The tape feeder 2 has a housing 21 which is elongated in the Y direction as viewed in a side view, and has a width in the X direction which allows storing of the component storing tape 3 in the housing 21. An opening which forms the component takeout position HT is disposed in the vicinity of a downstream end (+Y side end portion) of the housing 21 in a tape feeding direction H. Each tape feeder 2 supplies the components E stored in the component storing tape 3 toward the component takeout position HT. The heads 14H of the head unit 14 suck the components E at the component takeout position HT (see FIG. 4).

As shown in FIG. 3, the component storing tape 3 is formed of a carrier tape 31 and a cover tape 32. The carrier tape 31 is a tape on which component storing portions 33 which are recessed portions for storing the components E are disposed at a predetermined interval. Engaging holes 34 are disposed on one end portion of the carrier tape 31 in a width direction of the carrier tape 31 in a row at a predetermined interval. The engaging holes 34 engage with teeth portions of first, second and third sprockets 23A, 23B, and 23C described later, and conveyance force for feeding the component storing tape 3 is transmitted to the engaging holes 34 by these sprockets. The cover tape 32 is a tape which is adhered to the carrier tape 31 so as to cover the component storing portions 33. The component E is, for example, a small-piece like chip component such as a transistor, a resistor, a capacitor, an integrated circuit component (IC) or the like.

The housing 21 has a tape inlet 211 on an end surface thereof on a −Y side, and a tape outlet 212 on an end surface thereof on a +Y side. The component storing tapes 3 (the first and second component storing tapes 3A, 3B described later) are inserted into the tape inlet 211. The component storing tape 3 to which processing for taking out the components E is applied at the component takeout position HT is discharged from the tape outlet 212 as a waste tape. A grip portion 213 is attached on an upper surface (an end surface on the +Z side) of the housing 21. A user uses the grip portion 213 at the time of carrying the tape feeder 2.

The housing 21 includes a first housing 21A disposed on a −Y side; a second housing 21B disposed on a +Y side; and a third housing 21C disposed on a −Z side of the second housing 21B. The first and second housings 21A and 21B are continuously formed in the Y direction, the tape inlet 211 is formed in the first housing 21A, and the tape outlet 212 is formed in the second housing 21B.

In the inside of the first and second housings 21A, 21B, a tape conveyance path 22 and a tape feeding unit 23 are disposed. The tape conveyance path 22 is a conveyance path for conveying the component storing tape 3 in the tape feeding direction H (the direction directed from −Y to +Y) between the tape inlet 211 and the tape outlet 212. The tape feeding unit 23 gives the component storing tape 3 a drive force for advancing the component storing tape 3 along the tape conveyance path 22.

The tape conveyance path 22 includes a first conveyance path 22A, a second conveyance path 22B, and a third conveyance path 22C which are sequentially and continuously arranged in the tape feeding direction H. The first conveyance path 22A extends horizontally in the +Y direction from the tape inlet 211 in the first housing 21A. The second conveyance path 22B strides over the first and second housings 21A, 21B, and extends in the +Y direction upwardly and in an inclined manner from a +Y side end portion of the first conveyance path 22A. The third conveyance path 22C extends horizontally in the +Y direction from a +Y side end portion of the second conveyance path 22B to the tape outlet 212 in the second housing 21B. The third conveyance path 22C is a conveyance path disposed along an upper surface 214 of the second housing 21B, and a component takeout position HT is set in the vicinity of a downstream end of the third conveyance path 22C. A tape guide 24 which guides traveling of the component storing tape 3 is mounted on the third conveyance path 22C.

The tape feeding unit 23 includes the first sprocket 23A; the second sprocket 23B; the third sprocket 23C; and motors not shown in FIG. 2 (a first motor M1, a second motor M2 shown in FIG. 5) which give a rotational drive force to these sprockets. Each of these first to third sprockets 23A to 23C includes a rotary wheel having a disk shape; and a plurality of teeth portions arranged on an outer peripheral edge of the rotary wheel at a predetermined pitch (a pitch which is equal to an arrangement pitch of the engaging holes 34 formed in the component storing tape 3). When these teeth portions are fitted in the engaging holes 34 and the rotary wheel is rotated, the component storing tape 3 is fed.

The first sprocket 23A is rotatably supported by the first housing 21A in the vicinity of the tape inlet 211. The teeth portions of the first sprocket 23A face the first conveyance path 22A, and the component storing tape 3 is fed to a downstream of the tape conveyance path 22 due to the rotation of the first sprocket 23A.

The second sprocket 23B and the third sprocket 23C are rotatably supported by the second housing 21B in a state where the second sprocket 23B and the third sprocket 23C are horizontally arranged at a predetermined interval in the Y direction. The third sprocket 23C is disposed in the vicinity of the tape outlet 212, and the second sprocket 23B is disposed upstream of the third sprocket 23C in the tape feeding direction H. The second and third sprockets 23B, 23C are rotated synchronously with each other, and the teeth portions of the respective second and third sprockets 23B, 23C face the third conveyance path 22C. Due to the rotation of the second and third sprockets 23B, 23C, the component storing tape 3 is pulled out from the reel side and sent out of the housing 21 from the tape outlet 212.

In the vicinity of the tape inlet 211 of the housing 21, a tape mounting jig 25 which is slidably movable in the Y direction is mounted. The tape mounting jig 25 is a jig which is used at the time of loading the component storing tape 3 at the component takeout position HT by making a distal end portion of the component storing tape 3 engage with the teeth portions of the first sprocket 23A by meshing. The tape mounting jig 25 also plays a role of releasing meshing engagement between the first sprocket 23A and the component storing tape 3 after the distal end portion of the loaded component storing tape 3 engages with the teeth portions of the second and third sprockets 23B, 23C by meshing.

In the housing 21, a first sensor SN1 (component sensor/tape sensor), a second sensor SN2, and a third sensor SN3 are disposed. The first to third sensors SN1 to SN3 are sensors which detect the presence or non-presence of the component storing tape 3 or the presence or the non-presence of component in the component storing tape 3. For example, as the first to third sensors SN1 to SN3, it is possible to use a light quantity sensor which receives inspection light emitted from light sources disposed on both sides of the tape conveyance path 22 in a sandwiching manner. It is possible to discriminate the following three cases (1) to (3) from each other based on a quantity of light which the light quantity sensor receives or the difference in the distribution of a quantity of light. (1) A case where the component storing tape 3 which stores the component exists on the tape conveyance path 22. (2) A case where the component storing tape 3 which stores no component exists on the tape conveyance path 22. (3) A case where the component storing tape 3 does not exist on the tape conveyance path 22.

In the housing 21 (second housing 21B), the first sensor SN1 is disposed slightly upstream of the component takeout position HT in a tape feeding direction H (in the vicinity of the component takeout position HT) in a state where the first sensor SN1 oppositely faces the tape conveyance path 22. The first sensor SN1 is a sensor (component sensor) which detects whether or not the component storing tape 3 is supplied to the component takeout position HT in a state where the components E are stored in the component storing tape 3. That is, the first sensor SN1 is a sensor which detects the runout of the component storing tape 3. As a mode for detecting the runout of the components, it can be determined that the runout of the components occurs when a component takeout error (a suction error of the component) at the component takeout position HT occurs predetermined times continuously and the second sensor SN2 does not detect the component storing tape 3. Alternatively, at a point of time that the components the number of which is smaller than the number of components preliminarily stored in a memory as the number of components stored in the component storing tape 3 wound around a reel by a preset number are supplied, it may be determined that the runout of the component occurs regardless of a detection result of the presence or non-presence of the component storing tape 3 by the second sensor SN2. The first sensor SN1 is also a sensor (tape sensor) which detects whether or not the component storing tape 3 is present.

The second sensor SN2 is a sensor disposed upstream of the first sensor SN1 in the tape feeding direction H. In the first housing 21A, the second sensor SN2 is disposed slightly downstream of the first sprocket 23A in a state where the second sensor SN2 faces the tape conveyance path 22. The second sensor SN2 is a sensor which detects a rear end of the component storing tape 3 in the tape feeding direction H. The third sensor SN3 is disposed in the vicinity of the position at which the tape mounting jig 25 is disposed in the first housing 21A, that is, in the vicinity of the tape inlet 211. The third sensor SN3 is a sensor which detects whether or not the succeeding component storing tape 3 is mounted at the predetermined position of the tape inlet 211.

In the third housing 21C, a control board (a control circuit 201 shown in FIG. 5) which controls an operation of the tape feeder 2 and the like are housed. A connector 215 is mounted on a side surface of the third housing 21C on a +Y side. Electricity is supplied to the connector 215 from the component mounting apparatus 1 by way of a cable not shown in the drawing. Various control signals are also supplied to the connector 215 by way of the cable. A feeder recording portion 26 is mounted on a side surface of the third housing 21C on a +X side. Feeder information for identifying the tape feeder 2 is recorded in the feeder recording portion 26.

[Automatic Loading Mechanism]

Figure 4:
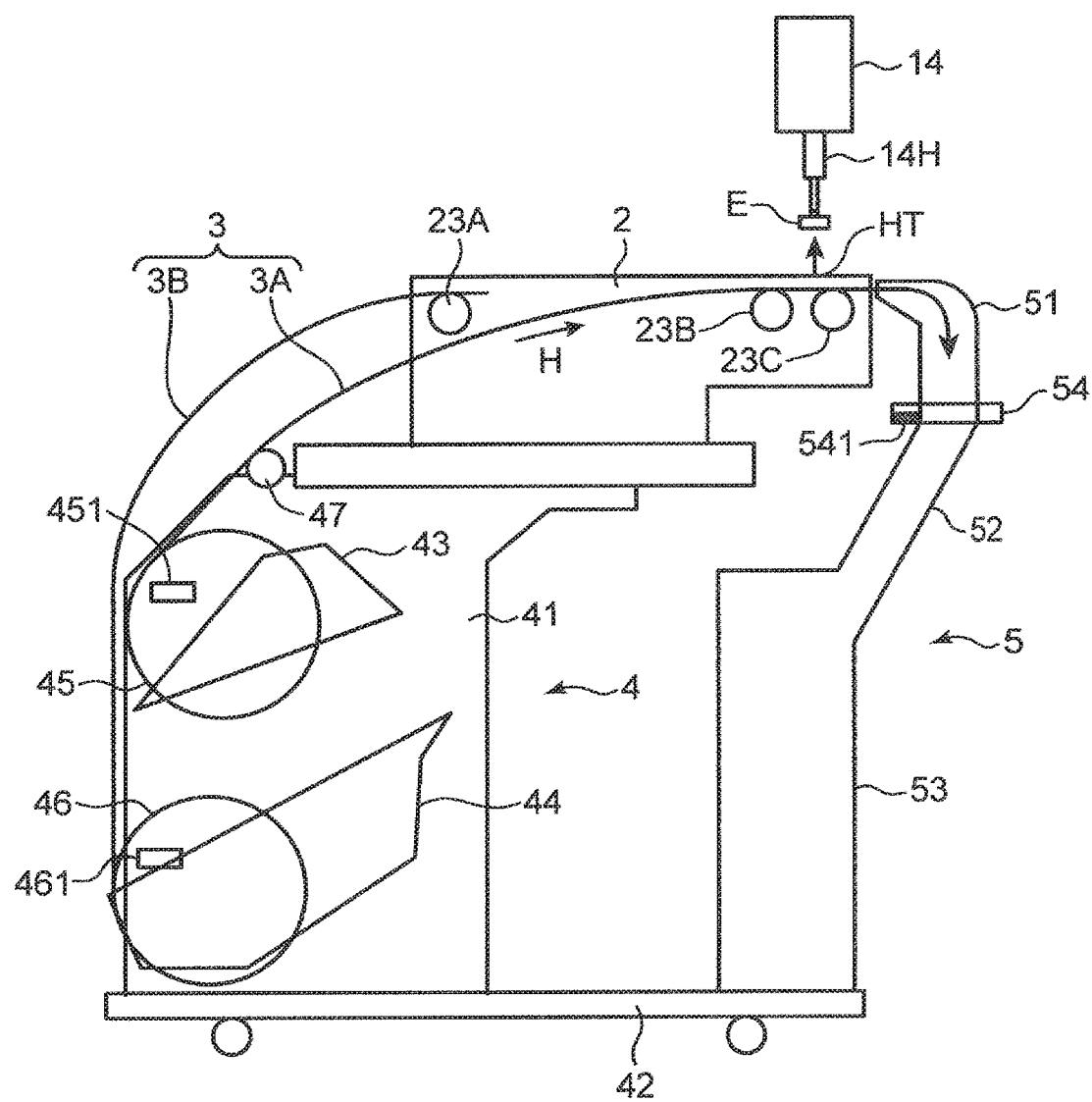
FIG. 4 is a side view schematically showing the overall configuration of the component supply device.

FIG. 4 is a side view schematically showing the overall configuration of the component supply units 20A to 20D including the tape feeder 2. In this embodiment, two component storing tapes 3 are mountable in the tape feeder 2. That is, the first component storing tape 3A into which the supply of the components E is performed precedingly, and the second component storing tape 3B into which the supply of the components E is performed succeedingly can be mounted in the tape feeder 2.

To roughly describe the manner of operation, the tape feeder 2 supplies components E to the component takeout position HT by intermittently reeling out the preceding first component storing tape 3A. When the first component storing tape 3A runs out, the succeeding second component storing tape 3B is automatically loaded. The components E are supplied to the component takeout position HT by intermittently reeling out the second component storing tape 3B. From now on, this second component storing tape 3B becomes the "preceding first component storing tape 3A", and a new second component storing tape 3B which is to be automatically loaded next is mounted on the tape mounting jig 25.

Each of the tape feeders 2 of the component supply units 20A to 20D is supported by a cart 4. The cart 4 includes a reel support portion 41; and a cart base unit 42 having casters which supports a lower surface of the reel support portion 41. A first reel holder 43 on an upper stage side and a second reel holder 44 on a lower stage side are mounted on the reel support portion 41. A first reel 45 around which the preceding first component storing tape 3A is wound is rotatably supported on the first reel holder 43. A second reel 46 around which the succeeding second component storing tape 3B is wound is rotatably supported on the second reel holder 44.

A first recording portion 451 and a second recording portion 461 are respectively mounted on a side surface of the first reel 45 and a side surface of the second reel 46. In the first and second recording portions 451, 461, the following information is recorded. That is, component identification information for identifying the components E stored in the component storing tapes 3A, 3B respectively wound around the first and second reels 45, 46, component kind information relating to kinds of components, component number information relating to the number of components per one reel, identification information for identifying the reels, lot identification information for identifying lots of the reels and the like are recorded. Each of the first and second recording portions 451, 461 is formed of, for example, a bar code in which read component information is encoded and recorded.

FIG. 4 shows a state where the first component storing tape 3A reeled out from the first reel 45 is fed out by the tape feeder 2. The first component storing tape 3A enters the tape feeder 2 while being guided by a guide roller 47 which is disposed on an upper end of the reel support portion 41, and engages with the second and third sprockets 23B, 23C by meshing. Due to the rotation of the second and third sprockets 23B, 23C, the first component storing tape 3A is intermittently fed out by way of the component takeout position HT. At the component takeout position HT, the component E is taken out by the head 14H of the head unit 14. The second component storing tape 3B stands by in a state where a distal end of the second component storing tape 3B is engageable with the first sprocket 23A by meshing.

When feeding out of the first component storing tape 3A from the state shown in FIG. 4 progresses and the runout of the components in the first component storing tape 3A is detected by the first sensor SN1, an automatic loading operation is performed. In general, a surplus length portion where the components E are not stored is formed on a rearmost end of the component storing tape 3. When the first sensor SN1 detects the runout of the components in the first component storing tape 3A, such detection means that a most upstream part of the surplus length portion reaches the component takeout position HT. In this case, a tape discharging operation is performed until a terminal end of the first component storing tape 3A is completely fed out. Accordingly, the surplus length portion is discarded.

Before the above-mentioned tape discharging operation is performed, an operator makes a distal end portion of the second component storing tape 3B engage with the first sprocket 23A by fitting using the tape mounting jig 25. Then, after the above-mentioned tape discharging operation is performed, the first sprocket 23A is rotated so that the second component storing tape 3B is fed out. Then, a distal end portion of the second component storing tape 3B engages with the second sprocket 23B by meshing. Subsequently, due to a rotational drive force of the second sprocket 23B, the second component storing tape 3B is fed out (the first sprocket 23A being held in an idling state).

Then, the operator performs an operation of releasing engagement between the second component storing tape 3B and the first sprocket 23A by fitting. At this stage of the operation, the second component storing tape 3B becomes "preceding first component storing tape 3A". The operator mounts the reel on which a new second component storing tape 3B is wound to the reel support portion 41, and attaches a distal end portion of the new second component storing tape 3B on the tape mounting jig 25, thus completing preparation for next automatic loading.

A waste tape recovery unit 5 is mounted on the cart 4. The waste tape recovery unit 5 includes an upstream duct 51, a downstream duct 52, a recovery box 53 and a cutter device 54. The upstream duct 51 and the downstream duct 52 are ducts which are continuously formed with the tape outlet 212 of the tape feeder 2. That is, the upstream duct 51 and the downstream duct 52 are ducts which guide the first component storing tape 3A which is discharged from the tape outlet 212 and to which process of taking out the components E is already applied (waste tape) into a predetermined direction, that is, into the recovery box 53 disposed below the tape outlet 212. The recovery box 53 is a box for storing the waste tape. The cutter device 54 includes a cutter blade 541, and is disposed between the upstream duct 51 and the downstream duct 52. A cutting operation for cutting the waste tape can be performed by projecting the cutter blade 541 into a duct inner path. With such a cutting operation, it is possible to prevent clogging of the waste tape which occurs in the upstream duct 51 or the downstream duct 52 when a unit length of the waste tape becomes excessively large.

[Control Configuration]

Figure 5:
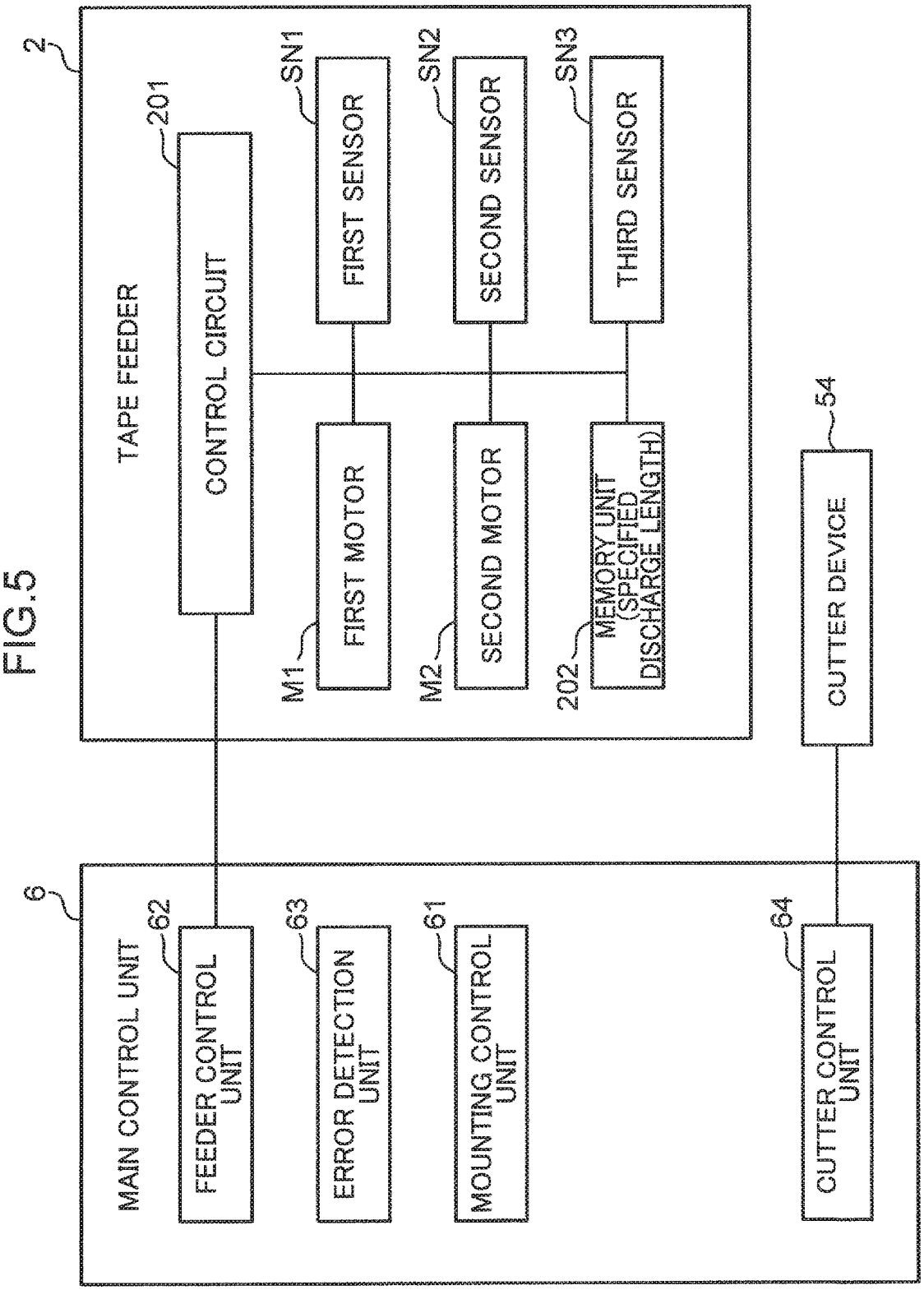
FIG. 5 is a block diagram showing the control configuration of the component mounting apparatus.

FIG. 5 is a block diagram showing the control configuration of the component mounting apparatus 1. The tape feeder 2 includes, in addition to the above-mentioned configurations, a first motor M1 and a second motor M2, a control circuit 201 (forming a part of the control unit), and a memory unit 202. The component mounting apparatus 1 includes a main control unit 6 (forming a part of the control unit) which controls an operation of the component mounting apparatus 1 in a comprehensive manner. The main control unit 6 functionally includes a mounting control unit 61, a feeder control unit 62, an error detection unit 63, and a cutter control unit 64.

The first motor M1 is a motor which generates a drive force for rotating the first sprocket 23A. The second motor M2 is a motor for generating a drive force for rotating the second and third sprockets 23B, 23C synchronously.

The control circuit 201 controls a tape feeding operation of intermittently feeding out the first and second component storing tapes 3A, 3B in the tape feeding direction H. Specifically, the control circuit 201 controls operations of the first motor M1 and the second motor M2 based on a component detection result or a tape detection result of the first to third sensors SN1 to SN3 or based on a control signal transmitted from the feeder control unit 62 of the main control unit 6. Further, in this embodiment, with respect to the above-mentioned tape discharging operation which is performed after the runout of the components of the first component storing tape 3A is detected by the first sensor SN1, the control circuit 201 performs a tape feeding operation for feeding out a surplus length portion of the first component storing tape 3A by a specified discharge length A (see FIG. 2) stored in the memory unit 202 described below.

The memory unit 202 stores various information relating to the tape feeder 2, for example, information on kinds of the component storing tapes 3 which can be mounted, a feeding speed and a feeding pitch for each tape and the like. In this embodiment, the memory unit 202 also stores the above-mentioned specified discharge lengths A which are preliminarily determined for kinds of the tape feeders 2 which are mountable on the component supply units 20A to 20D. This function of the memory unit 202 may not be given to a tape feeder 2 side but to a main control unit 6 side of the component mounting apparatus 1. In this case, the memory unit stores a table in which identification IDs of the tape feeders 2 and the specified discharge lengths A are correlated with each other.

The specified discharge length A is a length for feeding out a remaining portion of the first component storing tape 3A by driving the second and third sprockets 23B, 23C in the above-mentioned tape discharging operation where the first component storing tape 3A in a runout state, that is, the first component storing tape 3A whose rear end is disposed close to the component takeout position HT is discharged from the tape feeder 2. As shown in FIG. 2, in this embodiment, the specified discharge length A is a length which corresponds to a length of the tape conveyance path 22 from the arrangement position of the second sensor SN2 to the component takeout position HT. There may be a case where a length of the housing 21 in the Y direction, the arrangement position of the second sensor SN2, a route of the tape conveyance path 22 and the like differ depending on a kind of the tape feeder 2. Accordingly, there may be a case where the specified discharge length A also differs depending on a kind of the tape feeder 2. In the memory unit 202, the specified discharge length A which is preliminarily determined is stored with respect to each tape feeder 2.

When the first sensor SN1 detects the runout of components of the first component storing tape 3A, the control circuit 201 controls the second motor M2 such that the second motor M2 performs a tape feeding operation for feeding out the first component storing tape 3A by the specified discharge length A. That is, basically, the control circuit 201 feeds out the first component storing tape 3A by a fixed length (specified discharge length A) which is preliminarily determined when the runout of the component of the storing tape is detected without depending on a tape detection result obtained by the first and second sensors SN1, SN2 or the like. Accordingly, a tape discharging operation can be finished temporarily and hence, it is possible to prevent the occurrence of a case where the tape discharging operation is continued endlessly due to a failure of a sensor or the like. Irregularities exist with respect to a length of a surplus length portion where the component E is not stored at a rearmost end of the component storing tape 3. Accordingly, it is desirable that the specified discharge length A be set to a length larger than the lengths of the surplus length portions of a large number of component storing tapes 3.

The mounting control unit 61 of the main control unit 6 controls carry-in and carry-out of the board P into and out of the component mounting apparatus 1, and an operation of mounting components on the board P in a comprehensive manner by controlling the conveyor 12, the head unit 14, the Y-axis drive mechanism 15, the X-axis drive mechanism 16, and the like. The feeder control unit 62 is communicably connected to the control circuits 201 of the respective tape feeders 2, and controls a component supply operation in the respective component supply units 20A to 20D in a comprehensive manner. The error detection unit 63 detects an error in a tape discharging operation such as an error where discharging of the first component storing tape 3A from the tape feeder 2 is not yet finished although the tape feeding operation by the specified discharge length A has been already performed, and transmits information on the error to a display unit not shown in the drawing. The cutter control unit 64 controls an operation of the cutter device 54 disposed in the waste tape recovery unit 5, that is, a waste tape cutting operation.

Hereinafter, a specific example of the tape discharging operation of the tape feeder 2 performed by the control circuit 201 or the main control unit 6 will be described. In this embodiment, an example is exemplified where tape feeding of the first component storing tape 3A is controlled based on a quantity of rotation of the second and third sprockets 23B, 23C generated by the second motor M2. Also with respect to a specified discharge length A, it is assumed that a quantity of rotation of the second and third sprockets 23B, 23C necessary for achieving tape feeding by the specified discharge length A is stored in the memory unit 202.

First Embodiment

Figure 6:
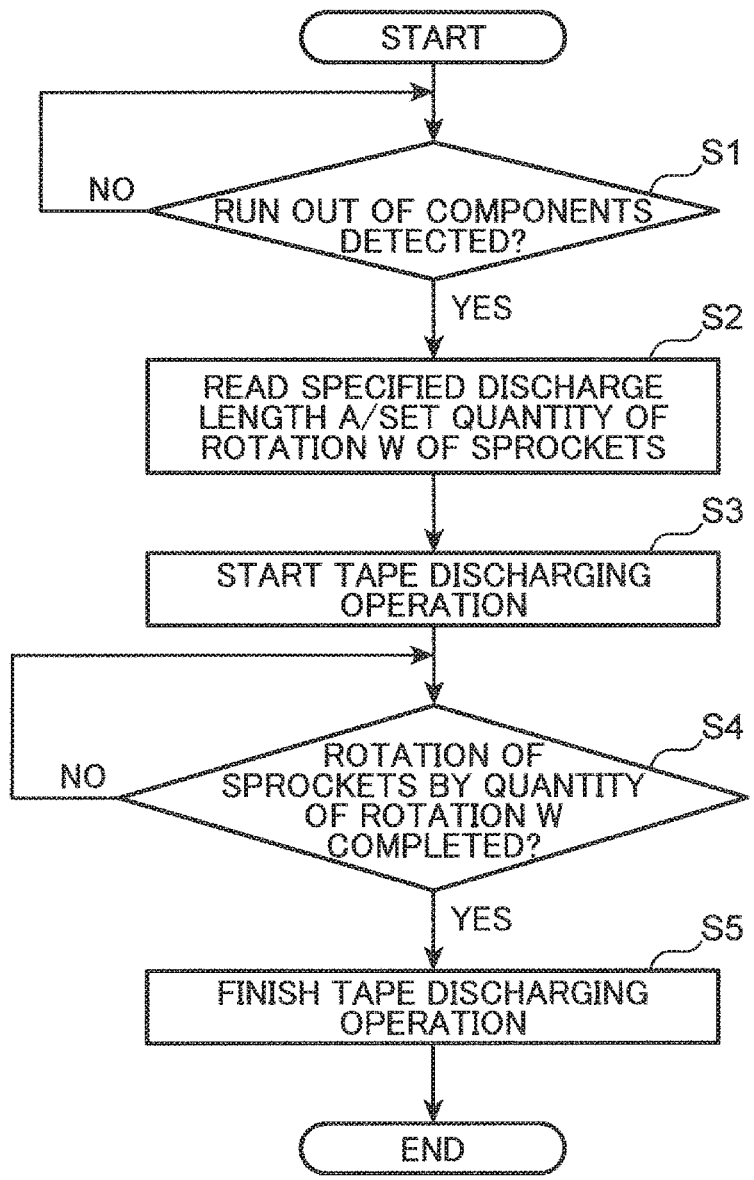
FIG. 6 is a flowchart showing a tape discharging operation according to a first embodiment of the present disclosure.

FIG. 6 is a flowchart showing the tape discharging operation according to the first embodiment of the present disclosure. FIGS. 7A to 7D are schematic views showing a state of progress of an automatic loading operation including a tape discharging operation according to the first embodiment. As shown in FIG. 7A, it is assumed that, at a point of time that the processing starts, the tape feeder 2 is in a state where the preceding first component storing tape 3A is fed out from the first reel 45, and a distal end of the succeeding second component storing tape 3B wound around the second reel 46 is set on the tape mounting jig 25.

The control circuit 201 checks whether or not the first sensor SN1 has detected that the component of the first component storing tape 3A runs out (step S1). When the first sensor SN1 has not yet detected that the first component storing tape 3A runs out of components (NO in step S1), the control circuit 201 continues the tape feeding operation of the first component storing tape 3A as it is.

On the other hand, when the first sensor SN1 has detected that the first component storing tape 3A runs out of components (YES in step S1), the control circuit 201 reads out, from the memory unit 202, a specified discharge length A, that is, a quantity of rotation W of the second and third sprockets 23B, 23C necessary for achieving tape feeding by the specified discharge length A with respect to the first component storing tape 3A, and sets the quantity of rotation W as control data for the second motor M2 (step S2). Then, the control circuit 201 starts a tape discharging operation for discharging a surplus length portion of the first component storing tape 3A (step S3).

FIG. 7B schematically shows the state of the tape feeder 2 at the time of detecting the previously-mentioned runout of components. In this embodiment, the state is exemplified where a rear end e of the first component storing tape 3A has passed the arrangement position of the second sensor SN2. That is, the case is exemplified where a length of the surplus length portion in which the component E is not stored is shorter than the specified discharge length A. In this case, unless there is no failure in a tape feeding drive system, the first component storing tape 3A can be discharged from the tape feeder 2 with certainty by performing tape feeding of the specified discharge length A. Even in the case where the first sensor SN1 detects that the component has run out, when the second sensor SN2 detects the presence of the first component storing tape 3A, a tape discharging operation may not be immediately performed, and a retry operation where the first component storing tape 3A is fed by one pitch or a plurality of pitches may be performed.

Then, the control circuit 201 checks whether or not the second and third sprockets 23B, 23C are rotated by a quantity of rotation W set in step S2 (step S4). When the rotation of the second and third sprockets 23B, 23C with the quantity of rotation W has not yet been completed (NO in step S4), tape feeding of the first component storing tape 3A is continued as it is. On the other hand, when the rotation of the second and third sprockets 23B, 23C with the quantity of rotation W has been completed (YES in step S4), the control circuit 201 finishes the tape discharging operation (step S5). In other words, regardless of whether or not the discharging of the first component storing tape 3A has actually been completed, the tape discharging operation is finished by performing tape feeding by the specified discharge length A.

FIG. 7C shows a state immediately before the rear end e of the first component storing tape 3A is discharged from the tape outlet 212 of the housing 21 by feeding the first component storing tape 3A by a length corresponding to the specified discharge length A. When the engagement by meshing between the first component storing tape 3A (waste tape) and the third sprocket 23C disposed on a most downstream side is released, the first component storing tape 3A falls through the upstream duct 51 and the downstream duct 52 and is recovered in the recovery box 53 (see FIG. 4).

FIG. 7D shows a state where the succeeding second component storing tape 3B reeled out from the second reel 46 is automatically loaded. After the preceding first component storing tape 3A is discharged, the control circuit 201 drives the first motor M1 to rotate the first sprocket 23A, and feeds the second component storing tape 3B until a distal end f of the second component storing tape 3B passes the component takeout position HT. Then, processing for taking out components from the second component storing tape 3B is performed.

As has been described heretofore, according to the first embodiment, the tape discharging operation is performed where a specified discharge length A is preliminarily set for each kind of tape feeder 2, and the first component storing tape 3A is fed out by a specified discharge length A when the components in the first component storing tape 3A run out. That is, regardless of the position of the rear end e of the first component storing tape 3A or the like, the control circuit 201 temporarily finishes a tape discharging operation of the first component storing tape 3A when a tape feeding operation by a specified discharge length A is performed.

Conventionally, after the runout of components in the first component storing tape 3A is detected, a tape discharging operation is performed until a tape sensor disposed in the vicinity of the tape outlet 212 detects a rear end e of the first component storing tape 3A. However, in this method, when the tape sensor cannot detect the rear end e of the first component storing tape 3A caused by any failure, the tape discharging operation is continued endlessly. For example, in the case where a failure occurs in the tape sensor or in a control system of the tape sensor, or in the case where the second and third sprockets 23B, 23C generate idling, there arises a drawback that the control circuit 201 of the tape feeder 2 cannot determine finishing of the tape discharging operation. On the other hand, in this embodiment, the control circuit 201 temporarily finishes a tape discharging operation when tape feeding by a specified discharge length A is performed. Accordingly, it is possible to prevent the occurrence of a wasteful operation that the above-mentioned tape discharging operation is continued endlessly when a failure occurs.

Second Embodiment

Figure 8:
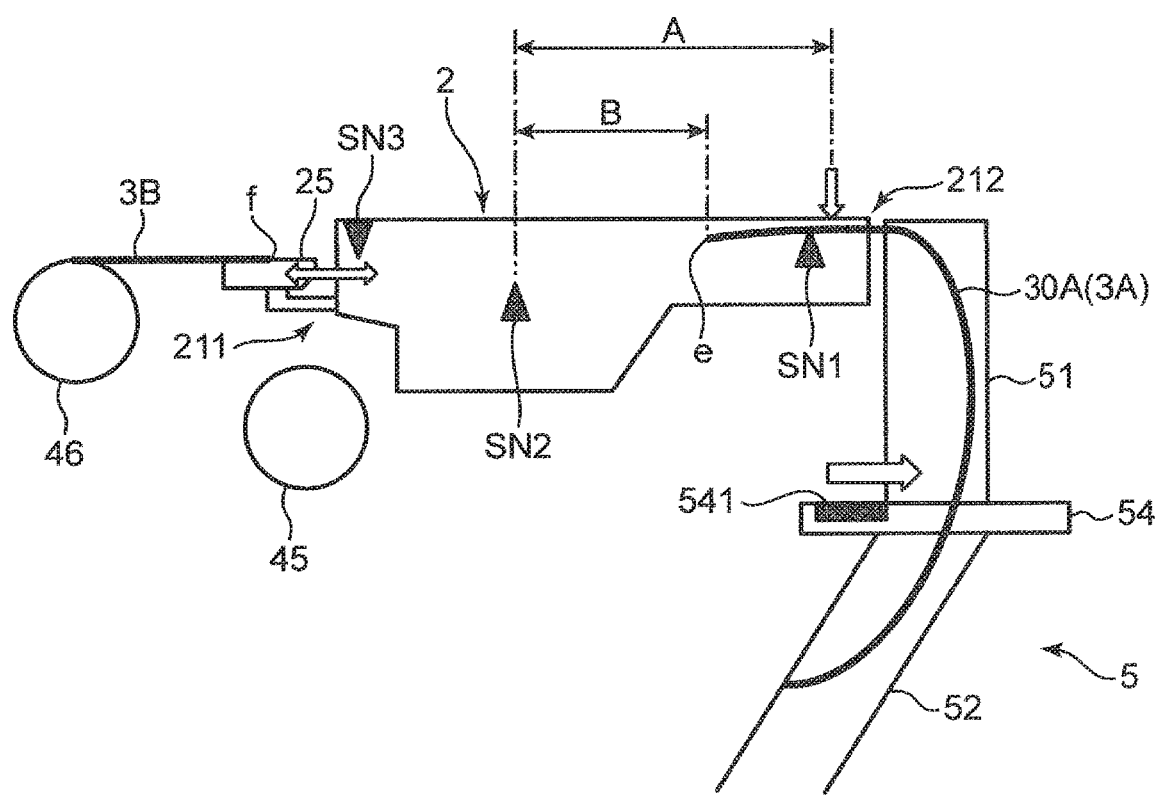
FIG. 8 is a schematic view for describing a cutting operation of cutting a waste tape which is performed in a second embodiment of the present disclosure.

In the second embodiment, an example is exemplified where tape feeding of a first component storing tape 3A is temporarily stopped in the middle of a tape discharging operation of the first component storing tape 3A by a specified discharge length A, and a waste tape of the first component storing tape 3A is cut in the first and second ducts 51, 52. FIG. 8 is a schematic view for describing a cutting operation of cutting a waste tape which is performed in the second embodiment of the present disclosure. FIG. 8 shows a mode where, in the above-mentioned tape discharging operation, a surplus length portion 30A in the vicinity of a rear end of the first component storing tape 3A is discharged from the tape feeder 2, and the surplus length portion 30A is guided to the recovery box 53 (FIG. 4) by the first and second ducts 51, 52.

Since the first component storing tape 3A is reeled out from a state where the first component storing tape 3A is wound around the first reel 45, curling tendency remains in the first component storing tape 3A. Accordingly, when an amount of the first component storing tape 3A corresponding to the specified discharge length A is discharged at a stroke, a distal end of the surplus length portion 30A which is curled by the above-mentioned curling tendency, is brought into or is stopped at a joining portion or a stepped portion in the ducts, thus giving rise to a case where the duct is clogged by the first component storing tape 3A. Even in the case where the first component storing tape 3A does not have curling tendency, when the surplus length portion 30A is elongated, clogging of the duct by the first component storing tape 3A may occur.

In the second embodiment, to overcome the above-mentioned clogging problem, a tape feeding operation of the first component storing tape 3A is performed by an amount corresponding to a cut length B shorter than the specified discharge length A and, thereafter, the tape feeding operation is temporarily stopped, and the surplus length portion 30A (waste tape) of the first component storing tape 3A is cut by the cutter device 54. Then, the tape feeding operation is restarted, and the tape feeding operation of the first component storing tape 3A of an amount corresponding to the specified discharge length A in total is completed.

The cut length B is set to a length which prevents clogging of the surplus length portion 30A in the first and second ducts 51, 52. To explain the case by taking one example, when the specified discharge length A is 200 mm, the cut length B can be set to approximately 80 to 120 mm. In this case, the temporary stopping of the tape feeding operation and the tape cutting operation of the surplus length portion 30A by the cutter device 54 are performed only one time. The cut length B may be set to a value which is equal to or less than a half of the specified discharge length A. In this case, the temporary stopping of the tape feeding operation and the tape cutting operation are performed plural times.

Figure 9:
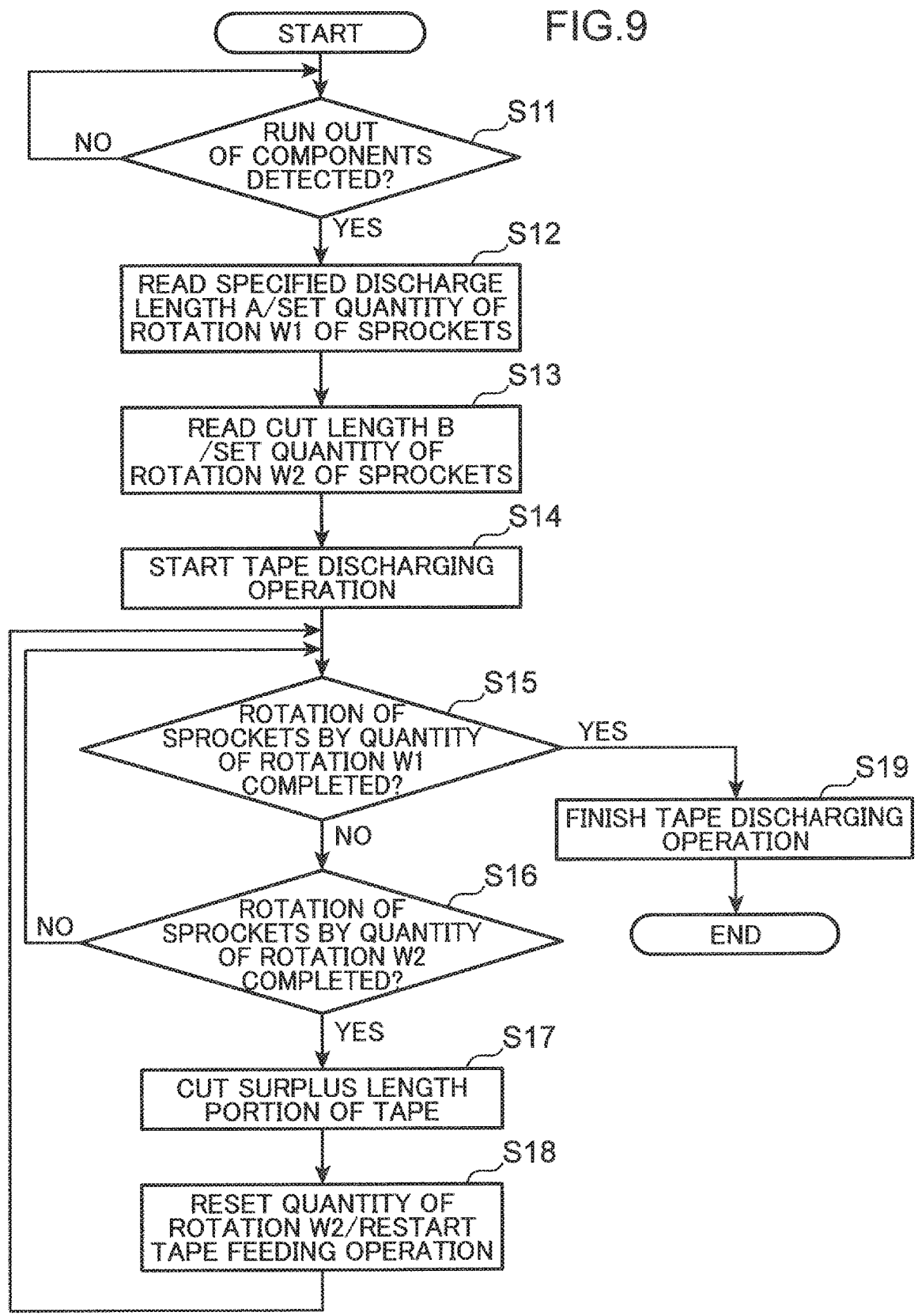
FIG. 9 is a flowchart showing a tape discharging operation according to the second embodiment of the present disclosure.

FIG. 9 is a flowchart showing a tape discharging operation according to the second embodiment. In this embodiment, a first quantity of rotation W1 and a second quantity of rotation W2 of the second and the third sprockets 23B, 23C necessary for achieving tape feeding by the specified discharge length A and the cut length B with respect to the first component storing tape 3A are stored in the memory unit 202 preliminarily.

The control circuit 201 of the tape feeder 2 checks whether or not the first sensor SN1 has detected that the first component storing tape 3A runs out of components (step S11). When the first sensor SN1 has not yet detected that the first component storing tape 3A runs out of components (NO in step S11), the control circuit 201 continues the tape feeding operation of the first component storing tape 3A as it is.

On the other hand, when the first sensor SN1 has detected that the first component storing tape 3A runs out of components (YES in step S11), the control circuit 201 reads out, from the memory unit 202, a specified discharge length A, that is, a first quantity of rotation W1 of the second and third sprockets 23B, 23C necessary for achieving tape feeding by the specified discharge length A with respect to the first component storing tape 3A, and sets the first quantity of rotation W1 as control data of a total quantity of rotation of the second motor M2 (step S12). Then, the control circuit 201 reads a second quantity of rotation W2 of the second and third sprockets 23B, 23C necessary for achieving tape feeding of the cut length B from the memory unit 202, and sets the second quantity of rotation W2 as control data of a unit quantity of rotation of the second motor M2 (step S13). Then, the control circuit 201 starts a tape discharging operation for discharging a surplus length portion 30A of the first component storing tape 3A (step S14).

Then, the control circuit 201 checks whether or not the second and third sprockets 23B, 23C are rotated by the first quantity of rotation W1 set in step S12 (step S15). When the rotation of the second and third sprockets 23B, 23C with the first quantity of rotation W1 has not yet been completed (NO in step S15), subsequently, the control circuit 201 checks whether or not the second and third sprockets 23B, 23C are rotated by the second quantity of rotation W2 set in step S13 (step S16). When the rotation of the second and third sprockets 23B, 23C with the second quantity of rotation W2 has not yet been completed (NO in step S16), the processing returns to step S15, and tape feeding of the surplus length portion 30A is continued as it is.

On the other hand, in step S16, when the rotation of the second and third sprockets 23B, 23C with the second quantity of rotation W2 has been completed (YES in step S16), a cutting operation of the surplus length portion 30A (waste tape) is performed (step S17). Specifically, the control circuit 201 stops driving of the second motor M2 and temporarily stops a tape feeding operation of the surplus length portion 30A. Further, the control circuit 201 transmits a request signal to the main control unit 6 for requesting the execution of a cutting operation of a waste tape. Upon reception of such a request signal, the cutter control unit 64 of the main control unit 6 makes the cutter device 54 execute the cutting operation. Accordingly, the surplus length portion 30A of the first component storing tape 3A is cut into a size equal to the cut length B.

Then, the control circuit 201 resets a counter of the second quantity of rotation W2 to zero, and starts driving of the second motor M2 so as to restart a tape feeding operation of the surplus length portion 30A (step S18). Then, the processing returns to step S15, and tape feeding of the surplus length portion 30A is continued in a state where an operator monitors a progress of the first quantity of rotation W1 and the second quantity of rotation W2.

In step S15, when the rotation of the second and third sprockets 23B, 23C with the first quantity of rotation W1 has been completed (YES in step S15), the control circuit 201 finishes the tape discharging operation (step S19). In other words, basically, tape feeding of the surplus length portion 30A is intermittently performed using the cut length B as a unit, and a tape discharging operation is finished at a point of time that a total discharge length reaches a specified discharge length A.

As has been described heretofore, according to the second embodiment, in the middle of the tape feeding operation by a specified discharge length A, a cutting operation of a surplus length portion 30A of the first component storing tape 3A is executed by the cutter device 54 in the first and second ducts 51, 52. Accordingly, the tape which corresponds to the surplus length portion 30A is shortened and hence, it is possible to prevent clogging of the tape in the first and second ducts 51, 52.

Third Embodiment

Figure 10:
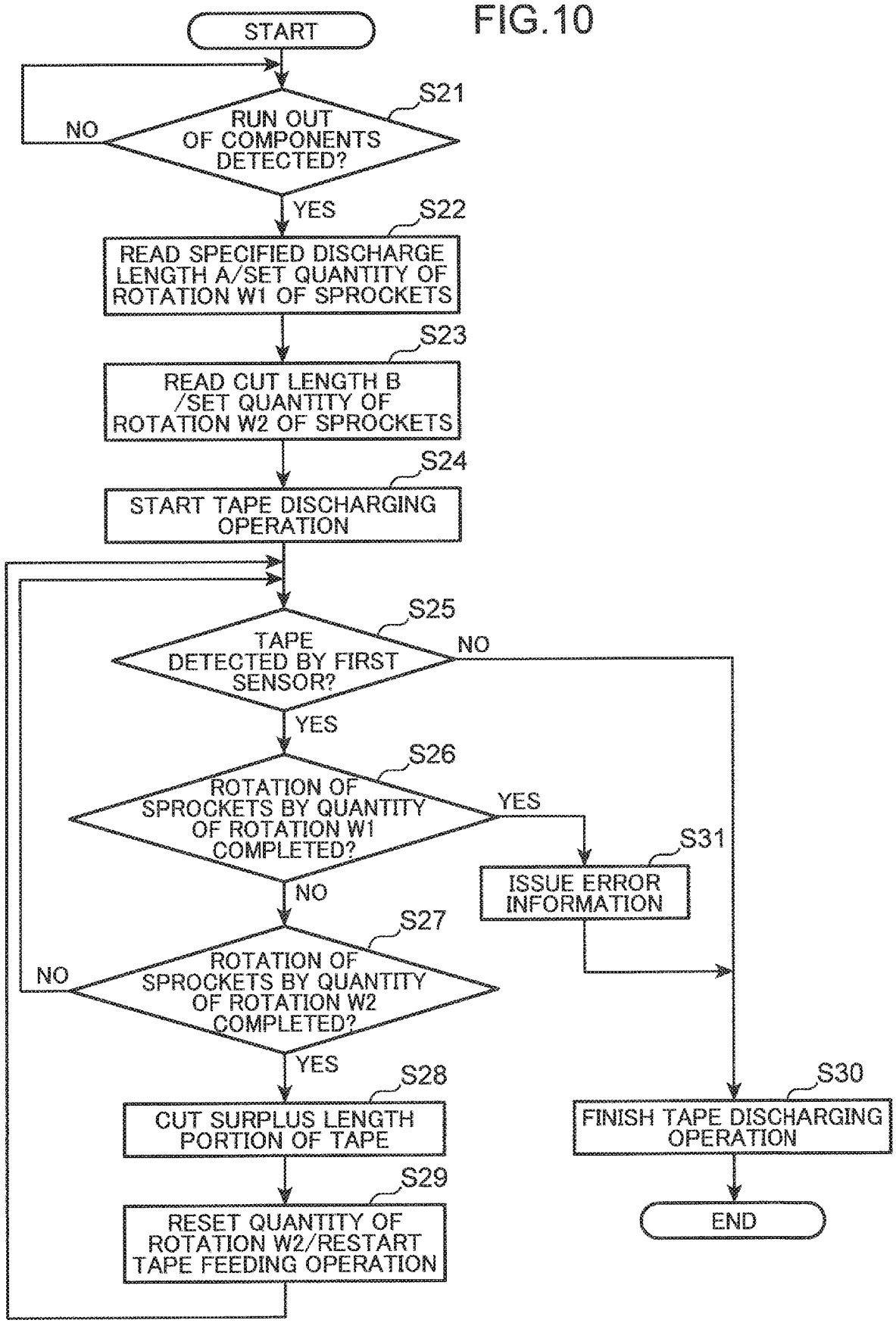
FIG. 10 is a flowchart showing a tape discharging operation according to a third embodiment of the present disclosure.

In the third embodiment, an example is exemplified where the configuration of the above-mentioned second embodiment is used as a base, and the first sensor SN1 is used as a tape sensor which detects the presence of the first component storing tape 3A thus enabling early finishing of a tape discharging operation or issuing of error information. FIG. 10 is a flowchart showing a tape discharging operation according to the third embodiment of the present disclosure. In the flowchart shown in FIG. 10, steps S21 to S24 are equal to steps S11 to S14 described previously in the second embodiment and hence, the description of steps S21 to S24 is omitted.

After a tape discharging operation of the surplus length portion 30A is started (step S24), the control circuit 201 checks whether or not the first sensor SN1 detects the first component storing tape 3A (step S25). For example, as exemplified in FIG. 7B and FIG. 8, in a state where a rear end e of the first component storing tape 3A has not passed a sensing area of the first sensor SN1, the first sensor SN1 detects the presence of the first component storing tape 3A (tape being present; YES in step S25).

In this case, in the same manner as the second embodiment, the control circuit 201 checks whether or not the second and third sprockets 23B, 23C are rotated by the first quantity of rotation W1 set in step S22 (step S26). When the rotation of the second and third sprockets 23B, 23C with the first quantity of rotation W1 has not yet been completed (NO in step S26), subsequently, the control circuit 201 checks whether or not the second and third sprockets 23B, 23C are rotated by the second quantity of rotation W2 set in step S23 (step S27). When the rotation of the second and third sprockets 23B, 23C with the second quantity of rotation W2 has not yet been completed (NO in step S27), the processing returns to step S25, and tape feeding of the surplus length portion 30A is continued as it is so long as the first sensor SN1 detects "tape being present" (YES in step S25).

On the other hand, in step S27, when the rotation of the second and the third sprockets 23B, 23C with the second quantity of rotation W2 has been completed (YES in step S27), a tape feeding operation of the surplus length portion 30A is temporarily stopped, and a cutting operation of the tape forming the surplus length portion 30A is performed (step S28). Accordingly, the surplus length portion 30A of the first component storing tape 3A is cut into a size equal to the cut length B. After that, the control circuit 201 resets the counter of the second quantity of rotation W2 to zero and restarts the tape feeding operation of the surplus length portion 30A (step S29). Then, the processing returns to step S25.

On the other hand, in step S25, when the first sensor SN1 no longer detects the presence of the first component storing tape 3A (no tape; YES in step S25), as illustrated in FIG. 7C, the rear end e of the first component storing tape 3A is in a state of having passed through the sensing area of the first sensor SN1 close to the third sprocket 23C at the most downstream position. In this case, the surplus length portion 30A of the first component storing tape 3A can be ejected from the tape feeder 2 without fully finishing the tape feeding operation corresponding to the specified discharge length A. Accordingly, in this case, even when a tape discharging operation is underway, the control circuit 201 finishes the tape discharging operation earlier by stopping driving of the second motor M2 (step S30). Timing at which the tape discharging operation is actually finished is timing that the first component storing tape 3A can be discharged from the tape feeder 2 after the first sensor SN1 detects "tape being not present", that is, timing that the engaging holes 34 formed in the first component storing tape 3A are disengaged from the teeth portions of the third sprocket 23C after the rear end e of the first component storing tape 3A passes the first sensor SN1.

On the other hand, in step S26, when the rotation of the second and third sprockets 23B, 23C with the first quantity of rotation W1 has been completed (YES in step S26), the main control unit 6 issues error information (step S31). This state is a state where the first sensor SN1 detects "tape being present" although a tape discharging operation by a specified discharge length A has been completed, that is, a state where discharging of the surplus length portion 30A from the tape feeder 2 has not been actually completed. This state may occur when a failure occurs in a tape feeding operation of the surplus length portion 30A due to idling of the second and third sprockets 23B, 23C or the like, when a length of the surplus length portion 30A is larger than a specified discharge length A, or when a failure occurs in the first sensor SN1.

In this case, the control circuit 201 stops the driving of the second motor M2 and stops the tape feeding operation of the surplus length portion 30A. Further, an error detection unit 63 of the main control unit 6 determines that an error has occurred when the above-mentioned state has occurred, and the error detection unit 63 issues, to the display unit not shown, error information indicating that the first component storing tape 3A has not been discharged from the tape feeder 2. Upon receiving such issuance of the error information, a user can take an appropriate measure.

As has been described above, according to the third embodiment, it is checked whether or not the first sensor SN1 disposed in the vicinity of a downstream end of the tape conveyance path 22 in the housing 21 detects the presence of the first component storing tape 3A, that is, whether or not the first component storing tape 3A remains in the housing 21 in a state where a tape feeding operation by a specified discharge length A has been completed. Accordingly, a user can grasp a state after the tape discharging operation of the first component storing tape 3A is performed, and can take various measures to cope with the state.

That is, when the first sensor SN1 detects "tape being present" at a point of time that the rotation of the second and third sprockets 23B, 23C with the first quantity of rotation W1 has been completed, the error detection unit 63 issues error information. Accordingly, it is possible to notify a user that the tape discharging operation of the preceding first component storing tape 3A has been defective. Accordingly, it is possible to urge the user to restore the tape feeder from the defective state. On the other hand, when the first sensor SN1 detects "tape being not present" in the middle of the tape discharging operation, the tape discharging operation is finished at this point of time without performing, in a rote routine, the tape feeding operation where the first component storing tape 3A is fully fed by a specified discharge length A. That is, it is possible to prevent the tape feeder 2 from performing a wasteful tape discharging operation after discharging of the first component storing tape 3A from the tape feeder 2 is substantially completed.

Fourth Embodiment

Figure 11:
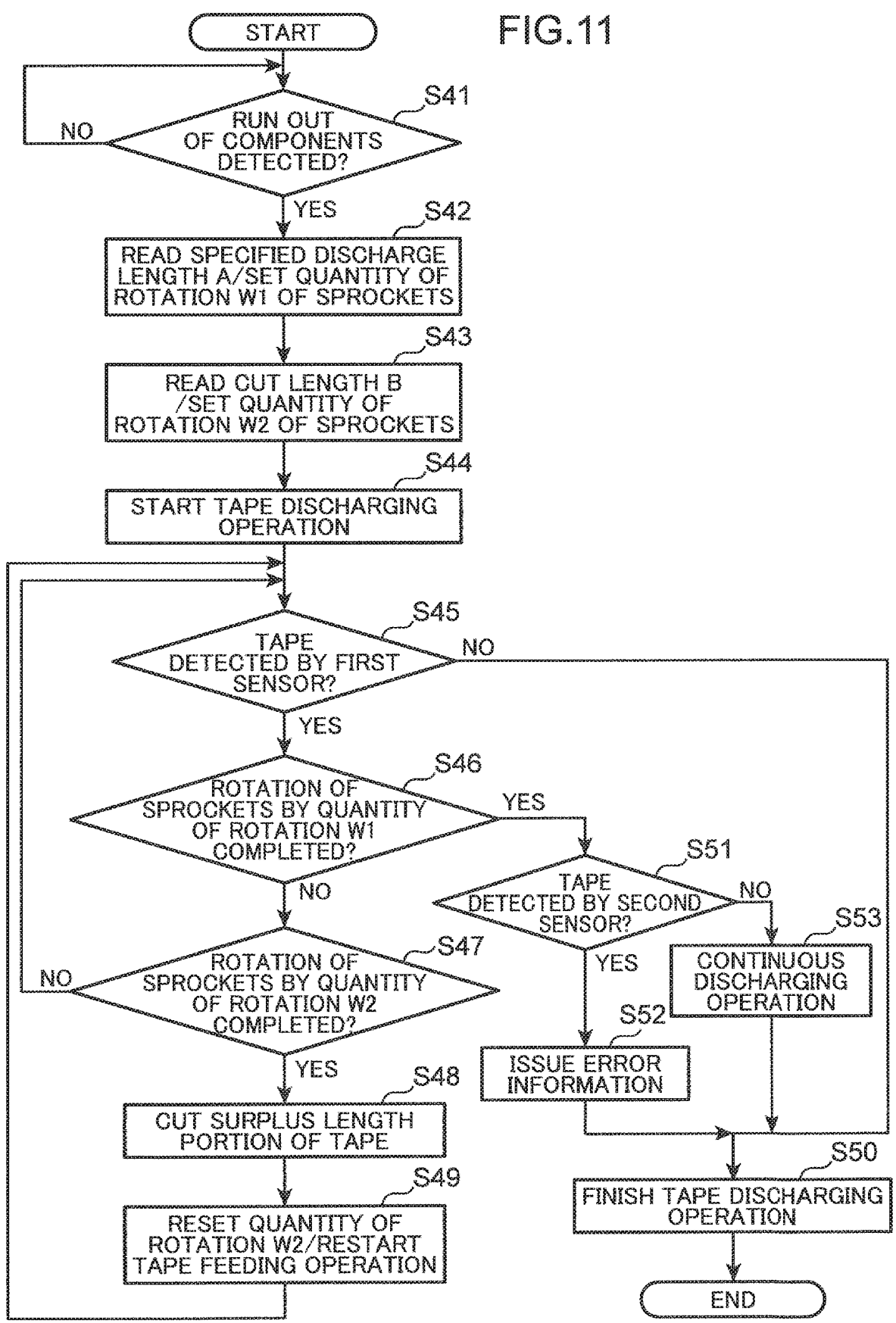
FIG. 11 is a flowchart showing a tape discharging operation according to a fourth embodiment of the present disclosure.

In the fourth embodiment, an example is exemplified where the configuration of the above-mentioned third embodiment is used as a base, and a state of the presence of the surplus length portion 30A of the first component storing tape 3A in the tape feeder 2 is checked by using the second sensor SN2, and a continuous discharging operation is performed in addition to a tape discharging operation by a specified discharge length A when the surplus length portion 30A can be discharged with a small amount of additional tape discharging operation. FIG. 11 is a flowchart showing a tape discharging operation according to the fourth embodiment of the present disclosure. In the flowchart shown in FIG. 11, steps S41 to S50 are equal to steps S21 to S30 described previously in the third embodiment and hence, the description of steps S41 to S50 is omitted.

In the third embodiment, in step S26 (corresponding to step S46 in the fourth embodiment), the example is exemplified where when the rotation of the second and third sprockets 23B, 23C with the first quantity of rotation W1 has been completed (YES in step S26), the main control unit 6 issues error information (step S31). In the fourth embodiment, without immediately issuing error information, after step S46, the control circuit 201 checks whether or not the second sensor SN2 detects the first component storing tape 3A (step S51).

In a state where a rear end e of the first component storing tape 3A has not passed a sensing area of the second sensor SN2, the second sensor SN2 detects the presence of the first component storing tape 3A (tape being present; YES in step SM). In this case, error information is issued in the same manner as the third embodiment (step S52). That is, the control circuit 201 stops the driving of the second motor M2 and stops the tape feeding operation of the surplus length portion 30A. Further, the error detection unit 63 of the main control unit 6 issues error information which indicates that discharging of the first component storing tape 3A has not been completed.

On the other hand, in step S51, when the second sensor SN2 has not detected the presence of the first component storing tape 3A (no tape; NO in step SM), the control circuit 201 performs a continuous discharging operation where an additional tape feeding operation is continued in addition to a tape feeding operation by a specified discharge length A which has been performed until such detecting operation is made (step S53).

The state where the second sensor SN2 detects "tape being not present" in step S51 is a state where although a tape feeding operation by a specified discharge length A has been performed, the rear end e of the first component storing tape 3A has not passed the position of the first sensor SN1 but has passed the position of the second sensor SN2. That is, the above-mentioned state is a state where when the tape feeding operation is continued a little more, the first component storing tape 3A can be discharged from the tape feeder 2. Accordingly, in such a case, based on a detection result of the second sensor SN2, the control circuit 201 determines that the first component storing tape 3A can be discharged from the tape feeder 2 by a tape feeding operation for a short period (continuous discharging operation) which follows a tape feeding operation by a specified discharge length A, and the above-mentioned continuous discharging operation is performed without issuing error information and hence, an automatic running of the component mounting apparatus 1 is continued. After the above-mentioned continuous discharging operation is performed for a predetermined period, the control circuit 201 finishes the tape discharging operation (step S50).

There may be a case where the first component storing tape 3A cannot be discharged even when the above-mentioned continuous discharging operation is performed. Accordingly, when the first sensor SN1 detects the presence of the first component storing tape 3A after the continuous discharging operation in step S53 is performed by a tape length which is preliminarily set, it is desirable that the error detection unit 63 issue error information which indicates that discharging of the first component storing tape 3A from the tape feeder 2 has not been completed. Accordingly, it is possible to notify a user that the above-mentioned continuous discharging operation of the first component storing tape 3A has been defective. Accordingly, it is possible to urge the user to restore the tape feeder from the defective state.

As has been described above, according to the fourth embodiment, it is determined whether or not the first component storing tape 3A can be discharged from the tape feeder 2 by the tape feeding operation for a short period (continuous discharging operation) which follows the tape feeding operation by the specified discharge length A, based on a detection result of the second sensor SN2. When the first component storing tape 3A can be discharged, by performing the above-mentioned continuous discharging operation following the tape feeding operation by the specified discharge length A, discharging of the preceding first component storing tape 3A can be achieved without stopping the automatic running.

The above-mentioned specific embodiments mainly include the following configurations.

According to an aspect of the present disclosure, there is provided a component supply device which includes a plurality of kinds of tape feeders configured to supply components stored in component storing tapes to a predetermined component takeout position, the tape feeders being capable of mounting and feeding a first component storing tape by which supplying of components is performed precedingly, and a second component storing tape by which supplying of components is performed succeedingly; a component sensor configured to detect runout of the components in the first component storing tape; and a control unit configured to control a tape feeding operation of the first and second component storing tapes in the plurality of kinds of tape feeders, wherein a specified discharge length by which the first component storing tape is discharged from the tape feeder at a time of occurrence of the runout of the components is preliminarily set for each kind of the tape feeder, and the control unit is configured to make the tape feeder perform a tape feeding operation for feeding the first component storing tape by the specified discharge length when the component sensor detects the runout of the components in the first component storing tape.

According to this component supply device, the tape discharging operation is performed where a specified discharge length is preliminarily set for each kind of tape feeder, and the first component storing tape is fed by a specified discharge length when the components in the first component storing tape run out. That is, regardless of the position of the rear end of the first component storing tape or the like, the control unit temporarily finishes a tape discharging operation of the first component storing tape when a tape feeding operation by a specified discharge length is performed. Accordingly, it is possible to prevent the occurrence of a wasteful operation that the above-mentioned tape discharging operation is continued endlessly, which may occur when the tape discharging operation is performed depending on a detection result of the tape sensor or the like.

In the above component supply device, it is desirable that the tape feeder include a tape outlet which discharges the first component storing tape to which component takeout processing is applied at the component takeout position as a waste tape, the component supply device further including a duct which is continuously connected to the tape outlet and guides the waste tape which is discharged from the tape outlet in a predetermined direction; and a cutter device which is disposed at a predetermined portion of the duct and performs a cutting operation for cutting the waste tape, and the control unit be configured to control an operation of the cutter device, the control unit making the tape feeder perform a tape feeding operation of the first component storing tape having a length shorter than the specified discharge length and thereafter temporarily stop the tape feeding operation, the control unit making the cutter device perform the cutting operation and thereafter making the tape feeder restart the tape feeding operation.

According to this component supply device, a cutting operation of cutting a waste tape is performed in the duct in the middle of the tape feeding operation by the specified discharge length. Accordingly, a size of the waste tape becomes short and hence, it is possible to prevent clogging of the waste tape in the duct.

In the above-mentioned component supply device, it is desirable that the tape feeder include a housing which has a tape inlet into which the first and the second component storing tapes are inserted, a tape outlet which discharges the first component storing tape to which component takeout processing is applied at the component takeout position as a waste tape, and a tape conveyance path through which the first and second component storing tapes are conveyed between the tape inlet and the tape outlet; and a tape sensor which is disposed at a predetermined position of the tape conveyance path, and detects presence of the first component storing tape, and the control unit be configured to check whether or not the tape sensor detects the presence of the first component storing tape in a state where the control unit makes the tape feeder complete a tape feeding operation by the specified discharge length.

According to the component supply device, it is checked whether or not the tape sensor disposed in the tape conveyance path in the housing detects the presence of the first component storing tape, that is, whether or not the first component storing tape remains in the housing in a state where the tape feeding operation by the specified discharge length has been completed. Accordingly, a user can grasp a state after the tape discharging operation of the first component storing tape and, thereafter, can take various measures to cope with the state.

In the component supply device, it is desirable that the control unit be configured to issue error information which indicates that discharging of the first component storing tape from the tape feeder has not been completed when the tape sensor detects the presence of the first component storing tape.

According to this component supply device, it is possible to notify a user that the above-mentioned tape discharging operation of the first component storing tape is defective by issuing the error information. Accordingly, it is possible to urge the user to restore the tape feeder from the defective state.

It is desirable that the component supply device include a memory unit configured to store the specified discharge length.

According to this component supply device, the specified discharge length can be suitably set and can be stored in the memory unit, and the control unit can control the tape discharging operation in each tape feeder by referencing data in the memory unit. For example, a table in which the above-mentioned specified discharge lengths are set in a correlated manner with control ID of a plurality of kinds of tape feeders can be stored in the memory unit.

In the above-mentioned component supply device, it is desirable that the tape feeder include a first sensor which is disposed in the vicinity of the component takeout position and detects the presence of the first component storing tape, and the control unit be configured to perform a control where when the first sensor no more detects presence of the first component storing tape during execution of the tape feeding operation of the first component storing tape by the specified discharge length, the tape feeding operation is finished at timing that the first component storing tape is dischargeable from the tape feeder.

According to this component supply device, the tape discharging operation of the first component storing tape can be finished by referencing a detection result of the first sensor without mechanically fully completing the tape feeding operation of the component storing tape by the specified discharge length. That is, it is possible to prevent the tape feeder from the performing a wasteful tape discharging operation after discharging of the first component storing tape from the tape feeder is substantially completed.

In the above-mentioned component supply device, it is desirable that the tape feeder include the first sensor which is disposed in the vicinity of the component takeout position and detects the presence of the first component storing tape; and the second sensor which is disposed upstream of the first sensor in a tape feeding direction and detects the presence of the first component storing tape, the control unit be configured to perform the tape feeding operation of the first component storing tape by the specified discharge length and, thereafter, be configured to perform continuous discharging where the tape feeding operation of the first component storing tape is continued when the first sensor detects the presence of the first component storing tape and the second sensor does not detect the presence of the first component storing tape.

The state where the first sensor detects the presence of the first component storing tape and the second sensor does not detect the presence of the first component storing tape may be referred to as a state where the first component storing tape can be discharged from the tape feeder by continuing the tape feeding operation for a short period. In such a state, by performing the above-mentioned continuous discharging subsequent to the tape feeding operation by the specified discharge length, discharging of the first component storing tape can be achieved.

In this case, it is desirable that the control unit be configured to issue error information which indicates that discharging of the first component storing tape from the tape feeder has not been completed when the first sensor detects the presence of the first component storing tape after the predetermined continuous discharging operation is performed.

According to this component supply device, it is possible to notify a user that the above-mentioned continuous discharging operation of the first component storing tape is defective by issuing error information. Accordingly, it is possible to urge the user to restore the tape feeder from the defective state.

According to another aspect of the present disclosure, there is provided a tape feeder being capable of mounting and feeding a first component storing tape by which supplying of components is performed precedingly, and a second component storing tape by which supplying of components is performed succeedingly, the tape feeder being configured to supply the components stored in the first and second component storing tapes to a predetermined component takeout position, the tape feeder including a component sensor configured to detect runout of the components in the first component storing tape; and a control unit configured to control a tape feeding operation of the first and second component storing tapes in the plurality of kinds of tape feeders, wherein the control unit is configured to make the tape feeder perform a tape feeding operation for feeding the first component storing tape by a specified discharge length which is preliminarily determined for feeding the first component storing tape from the tape feeder when the component sensor detects the runout of the components in the first component storing tape.

According to the present disclosure described above, in a component supply device including the automatic loading type tape feeder, after a runout of components of a preceding component storing tape is detected, a tape discharging operation of the component storing tape can be performed properly without producing a waste.

What is claimed is:

1. A component supply device comprising:
    a plurality of kinds of tape feeders configured to supply components stored in component storing tapes to a predetermined component takeout position, the tape feeders being configured to mount and feed a first component storing tape by which supplying of components is performed precedingly, and a second component storing tape by which supplying of components is performed succeedingly;
    a component sensor configured to detect runout of the components in the first component storing tape;
    a controller configured to control a tape feeding operation of the first and second component storing tapes in the plurality of kinds of tape feeders; and
    a memory configured to store a specified discharge length by which the first component storing tape is discharged from a specific tape feeder of the plurality of kinds of tape feeders when the runout of the components occurs, the specified discharge length being preliminarily set for each kind of the tape feeder,
    wherein
    the controller is configured, when the component sensor detects the runout of the components of the first component storing tape, to read the specified discharge length from the memory, to make the specific tape feeder perform the tape feeding operation for feeding the first component storing tape by the specified discharge length, and to make the specific tape feeder finish a tape discharging operation of the first component storing tape when the tape feeding operation by the specified discharge length is completed, and
    wherein
    the specific tape feeder includes a tape outlet which discharges the first component storing tape to which component takeout processing is applied at the component takeout position as a waste tape,
    the component supply device further comprises:
        a duct which is continuously connected to the tape outlet and guides the waste tape which is discharged from the tape outlet in a predetermined direction; and
        a cutter which is disposed at a predetermined portion of the duct and performs a cutting operation for cutting the waste tape, and
    the controller is configured to control an operation of the cutter, the controller making the specific tape feeder perform a tape feeding operation of the first component storing tape having a length shorter than the specified discharge length and thereafter temporarily stop the tape feeding operation, the controller making the cutter perform the cutting operation, making the specific tape feeder restart the tape feeding operation, and the specific tape feeder finishes the tape discharging operation of the first component storing tape when the specified discharge length in total is completed.

2. The component supply device according to claim 1, wherein
    the specific tape feeder includes:
        a housing which has a tape inlet into which the first and the second component storing tapes are inserted, a tape outlet configured to discharge the first component storing tape to which component takeout processing is applied at the component takeout position as a waste tape, and a tape conveyance path through which the first and second component storing tapes are conveyed between the tape inlet and the tape outlet; and
        a tape sensor which is disposed at a predetermined position of the tape conveyance path, and configured to detect presence of the first component storing tape, and
    the controller is configured to check whether or not the tape sensor detects the presence of the first component storing tape in a state where the controller makes the specific tape feeder complete a tape feeding operation by the specified discharge length.

3. The component supply device according to claim 2, wherein
    the controller is configured to issue error information which indicates that discharging of the first component storing tape from the specific tape feeder has not been completed when the tape sensor detects the presence of the first component storing tape.

4. The component supply device according to claim 2, wherein
    the specific tape feeder includes: a first sensor which is disposed in a vicinity of the component takeout position and configured to detect the presence of the first component storing tape; and a second sensor which is disposed upstream of the first sensor in a tape feeding direction and configured to detect the presence of the first component storing tape, and
    the controller is configured to perform the tape feeding operation of the first component storing tape by the specified discharge length and, thereafter, is configured to perform continuous discharging where the tape feeding operation of the first component storing tape is continued when the first sensor detects the presence of the first component storing tape and the second sensor does not detect the presence of the first component storing tape.

5. The component supply device according to claim 4, wherein
    the controller is configured to issue error information which indicates that discharging of the first component storing tape from the specific tape feeder has not been completed when the first sensor detects the presence of the first component storing tape after the predetermined continuous discharging is performed.

6. The component supply device according to claim 1, wherein
    the specific tape feeder includes a first sensor which is disposed in a vicinity of the component takeout position, and configured to detect presence of the first component storing tape, and
    the controller is configured to perform a control where during execution of the tape feeding operation of the first component storing tape by the specified discharge length, the tape feeding operation is finished when the first sensor no longer detects presence of the first component storing tape during execution of the tape feeding operation.

7. A component supply device comprising:
a plurality of kinds of tape feeders configured to supply components stored in component storing tapes to a predetermined component takeout position, the tape feeders being configured to mount and feed a first component storing tape by which supplying of components is performed precedingly, and a second component storing tape by which supplying of components is performed succeedingly;
a component sensor configured to detect runout of the components in the first component storing tape;
a controller configured to control a tape feeding operation of the first and second component storing tapes in the plurality of kinds of tape feeders; and
a memory configured to store a specified discharge length by which the first component storing tape is discharged from a specific tape feeder of the plurality of kinds of tape feeders when the runout of the components occurs, the specified discharge length being preliminarily set for each kind of the tape feeder,
wherein
the controller is configured, when the component sensor detects the runout of the components of the first component storing tape, to read the specified discharge length from the memory, to make the specific tape feeder perform the tape feeding operation for feeding the first component storing tape by the specified discharge length, and to make the specific tape feeder finish a tape discharging operation of the first component storing tape when the tape feeding operation by the specified discharge length is completed, and
wherein
the specific tape feeder includes: a first sensor which is disposed in a vicinity of the component takeout position and configured to detect the presence of the first component storing tape; and a second sensor which is disposed upstream of the first sensor in a tape feeding direction and configured to detect the presence of the first component storing tape, and
the controller is configured to perform the tape feeding operation of the first component storing tape by the specified discharge length and, thereafter, is configured to perform continuous discharging where the tape feeding operation of the first component storing tape is continued when the first sensor detects the presence of the first component storing tape and the second sensor does not detect the presence of the first component storing tape.

8. The component supply device according to claim 7, wherein
the controller is configured to issue error information which indicates that discharging of the first component storing tape from the specific tape feeder has not been completed when the first sensor detects the presence of the first component storing tape after the predetermined continuous discharging is performed.

9. A tape feeder capable of mounting and feeding a first component storing tape by which supplying of components is performed precedingly, and a second component storing tape by which supplying of components is performed succeedingly, the tape feeder being configured to supply the components stored in the first and second component storing tapes to a predetermined component takeout position, the tape feeder comprising:
a component sensor configured to detect runout of the components in the first component storing tape;
a controller configured to control a tape feeding operation of the first and second component storing tapes in the tape feeder;
a memory configured to store a specified discharge length which is preliminarily set for discharging the first component storing tape from the tape feeder when the runout of the components occurs;
a first sensor which is disposed in a vicinity of the component takeout position and configured to detect the presence of the first component storing tape; and
a second sensor which is disposed upstream of the first sensor in a tape feeding direction and configured to detect the presence of the first component storing tape,
wherein
the controller is configured, when the component sensor detects the runout of the components in the first component storing tape, to read the specified discharge length from the memory, to perform a tape feeding operation for feeding the first component storing tape by the specified discharge length, and to finish a tape discharging operation of the first component storing tape when the tape feeding operation by the specified discharge length is completed, and
the controller is configured to perform the tape feeding operation of the first component storing tape by the specified discharge length and, thereafter, is configured to perform continuous discharging where the tape feeding operation of the first component storing tape is continued when the first sensor detects the presence of the first component storing tape and the second sensor does not detect the presence of the first component storing tape.

* * * * *